(12) United States Patent
Wu et al.

(10) Patent No.: US 11,670,663 B2
(45) Date of Patent: Jun. 6, 2023

(54) HIGH PERFORMANCE IMAGE SENSOR

(71) Applicant: Taiwan Semiconductor Manufacturing Co., Ltd., Hsin-Chu (TW)

(72) Inventors: Tung-Ting Wu, Taipei (TW); Jhy-Jyi Sze, Hsin-Chu (TW); Yimin Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 18 days.

(21) Appl. No.: 17/236,343

(22) Filed: Apr. 21, 2021

(65) Prior Publication Data

US 2021/0265412 A1 Aug. 26, 2021

Related U.S. Application Data

(63) Continuation of application No. 16/352,164, filed on Mar. 13, 2019, now Pat. No. 10,991,746.

(Continued)

(51) Int. Cl.
*H01L 27/146* (2006.01)
*H01L 31/036* (2006.01)

(52) U.S. Cl.
CPC .. *H01L 27/14636* (2013.01); *H01L 27/14607* (2013.01); *H01L 27/14643* (2013.01); *H01L 27/14689* (2013.01); *H01L 31/036* (2013.01)

(58) Field of Classification Search
CPC ......... H01L 27/14603; H01L 27/14607; H01L 27/14612; H01L 27/14621;

(Continued)

(56) References Cited

U.S. PATENT DOCUMENTS

| 5,030,828 A | * | 7/1991 | Solomon | ........... H01L 27/14649 |
| | | | | 250/370.08 |
| 5,279,924 A | | 1/1994 | Sakai et al. | |

(Continued)

FOREIGN PATENT DOCUMENTS

JP 2013033864 A 2/2013

OTHER PUBLICATIONS

Yokogawa et al. "IR Sensitivity Enhancement of CMOS Image Sensor With Diffractive Light Trapping Pixels." Scientific Reports, 7:3832, published on Jun. 19, 2017.

(Continued)

*Primary Examiner* — David C Spalla
(74) *Attorney, Agent, or Firm* — Eschweiler & Potashnik, LLC

(57) ABSTRACT

The present disclosure, in some embodiments, relates to an image sensing integrated chip. The image sensing integrated chip includes a semiconductor substrate having sidewalls defining one or more trenches on opposing sides of a region of the semiconductor substrate. One or more dielectrics are disposed within the one or more trenches. The semiconductor substrate has a plurality of flat surfaces arranged between the one or more trenches. Adjacent ones of the plurality of flat surfaces define a plurality of triangular shaped protrusions and alternative ones of the plurality of flat surfaces are substantially parallel to one another, as viewed along a cross-sectional view.

20 Claims, 14 Drawing Sheets

Related U.S. Application Data

(60) Provisional application No. 62/751,761, filed on Oct. 29, 2018.

(58) Field of Classification Search
CPC ......... H01L 27/14627; H01L 27/14643; H01L 27/14636; H01L 27/1464; H01L 27/14689; H01L 27/307; H01L 31/036
See application file for complete search history.

(56) References Cited

U.S. PATENT DOCUMENTS

| | | |
|---|---|---|
| 8,946,839 B1 | 2/2015 | Yap et al. |
| 10,991,746 B2* | 4/2021 | Wu .................. H01L 27/14607 |
| 2007/0031988 A1 | 2/2007 | Agranov et al. |
| 2017/0110493 A1* | 4/2017 | Yokogawa .......... H01L 27/1463 |
| 2018/0151615 A1 | 5/2018 | Wen et al. |
| 2018/0151759 A1 | 5/2018 | Huang et al. |
| 2018/0350853 A1 | 12/2018 | Huang et al. |
| 2018/0359434 A1* | 12/2018 | Tanaka .............. H01L 27/14623 |
| 2019/0148422 A1 | 5/2019 | Cheng et al. |
| 2019/0165026 A1 | 5/2019 | Kuo et al. |

OTHER PUBLICATIONS

Non-Final Office Action dated Apr. 2, 2020 for U.S. Appl. No. 16/352,164.
Final Office Action dated Oct. 14, 2020 for U.S. Appl. No. 16/352,164.
Notice of Allowance dated Dec. 24, 2020 for U.S. Appl. No. 16/352,164.

* cited by examiner

HIGH PERFORMANCE IMAGE SENSOR

REFERENCE TO RELATED APPLICATIONS

This application is a Continuation of U.S. application Ser. No. 16/352,164, filed on Mar. 13, 2019, which claims the benefit of U.S. Provisional Application No. 62/751,761, filed on Oct. 29, 2018. The contents of the above-referenced Patent Applications are hereby incorporated by reference in their entirety.

BACKGROUND

Integrated circuits (IC) with image sensors are used in a wide range of modern day electronic devices. In recent years, complementary metal-oxide semiconductor (CMOS) image sensors have begun to see widespread use, largely replacing charge-coupled device (CCD) image sensors. Compared to CCD image sensors, CMOS image sensors are increasingly favored due to low power consumption, a small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
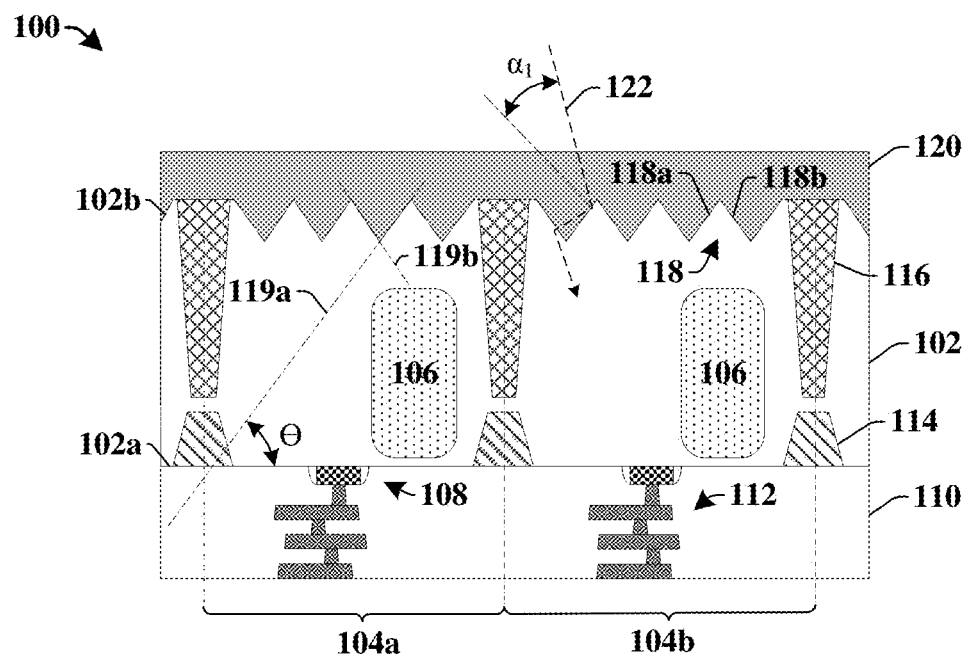
FIG. 1 illustrates a cross-sectional view of some embodiments of an image sensor integrated chip having an absorption enhancement structure defined by substantially flat surfaces.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

CMOS image sensors (CIS) typically comprise an array of pixel regions, which respectively have an image sensing element arranged within a semiconductor substrate. The image sensing elements are configured to receive incident light comprising photons. Upon receiving the light, the image sensing elements are configured to convert the light to electric signals. The electric signals from the image sensing elements can be processed by a signal processing unit to determine an image captured by the CIS.

Quantum efficiency (QE) is a ratio of a number of photons that contribute to an electric signal generated by an image sensing element within a pixel region to a number of photons incident on the pixel region. It has been appreciated that the QE of a CIS can be improved with on-chip absorption enhancement structures that are configured to increase an absorption of light by a substrate. For example, an absorption enhancement structure comprising protrusions arranged along a surface of a substrate can increase the substrate's absorption of light by decreasing a reflection of incident radiation along the surface. Such absorption enhancement structures typically comprise conical shaped protrusions extending outward from a substrate over an image sensing element. The conical shaped protrusions can be formed by performing a dry etching process on the substrate.

However, the dry etching process used to form such protrusions can result in plasma damage along outer edges of the protrusions. The plasma damage can lead to defects (e.g., interstitials) in a crystalline structure of the substrate, which can cause an increase in dark current and/or white pixel number. The increase in dark current and/or white pixel number causes charges to accumulate within an image sensing element when light is not impingent on the image sensing element, thereby becoming a major source of noise that can degrade image quality of a CIS. Furthermore, uncertainty in dry etching process tolerances can cause non-uniformities in the shapes of the protrusions. Such non-uniformities can lead to poor photo response non-uniformity (PNRU) (i.e., a difference between a true response from an image sensing element and a uniform response), which further degrades performance of an associated image sensing element.

The present disclosure relates to an image sensor integrated chip comprising an absorption enhancement structure defined by a plurality pyramidal shaped topographical features (e.g., recesses or protrusions). In some embodiments, the image sensor integrated chip may comprise an image sensing element disposed within a substrate. A plurality of conductive interconnect layers are arranged within a dielectric structure disposed along a first side of the substrate. A second side of the substrate comprises a plurality of interior sidewalls arranged over the image sensing element and defining pyramidal shaped topographical features. The interior sidewalls have substantially flat surfaces respectively extending along a plane in a first direction and in a second direction that is perpendicular to the first direction. The substantially flat surfaces are a result of wet etching processes that are used to form the topographical features. The wet etching processes are able form the topographical features while avoiding plasma damage that can occur during dry etching processes. Furthermore, the wet etching processes have highly controllable tolerances that provide for a homogeneous distribution of the topographical features, and which can improve a PRNU of the image sensing element.

FIG. 1 illustrates a cross-sectional view of some embodiments of an image sensor integrated chip 100 comprising an absorption enhancement structure.

The image sensor integrated chip 100 comprises a substrate 102 having a plurality of pixel regions 104a-104b. The plurality of pixel regions 104a-104b respectively comprise an image sensing element 106 configured to convert incident radiation (e.g., photons) into an electric signal (i.e., to generate electron-hole pairs from the incident radiation). In various embodiments, the image sensing element 106 may be configured to convert incident radiation having different ranges of wavelengths (e.g., wavelengths in a visible spectrum of radiation, wavelengths in an infrared spectrum of radiation, etc.) in the electrical signal. In some embodiments, the image sensing element 106 may comprise a photodiode, a phototransistor, or the like.

A plurality of transistor gate structures 108 are arranged along a first side 102a of the substrate 102. A back-end-of-the-line (BEOL) metallization stack is also arranged along the first side 102a of the substrate 102. The BEOL metallization stack comprises a dielectric structure 110 surrounding a plurality of conductive interconnect layers 112. In some embodiments, the dielectric structure 110 comprises a plurality of stacked inter-level dielectric (ILD) layers. In some embodiments, the plurality of conductive interconnect layers 112 comprise alternating layers of conductive vias and conductive wires, which are electrically coupled to the plurality of transistor gate structures 108.

In some embodiments, isolation structures (e.g., shallow trench isolation structures, deep trench isolation structures, isolation implants, etc.) may be arranged within the substrate 102 at locations between adjacent ones of the plurality of pixel regions 104a-104b. For example, in some embodiments, shallow trench isolation structures 114 may be arranged within the first side 102a of the substrate 102 between adjacent ones of the plurality of pixel regions 104a-104b. In some additional embodiments, back-side deep trench isolation (BDTI) structures 116 may be arranged within a second side 102b of the substrate 102 between the adjacent ones of the plurality of pixel regions 104a-104b. In some embodiments, the BDTI structures 116 may be directly over the shallow trench isolation structures 114. In other embodiments, the BDTI structures 116 may extend completely through the substrate 102 and the shallow trench isolation structures 114 may be omitted.

The second side 102b of the substrate 102 comprises a plurality of topographical features 118 arranged within the plurality of pixel regions 104a-104b. The plurality of topographical features 118 (e.g., pyramidal shaped protrusions and/or depressions) are defined by a plurality of interior surfaces 118a-118b of the substrate 102. The plurality of interior surfaces 118a-118b comprise substantially flat surfaces that respectively extend along planes 119a-119b extending in a first direction and in a second direction (e.g., into the plane of the paper) that is perpendicular to the first direction. The flatness of the plurality of interior surfaces 118a-118b is a result of a wet etching process used to form the topographical features 118. The planes 119a-119b are angled at an angle θ with respect to the first side 102a of the substrate 102. In some embodiments, the angle θ may be in a range of between approximately 30° and approximately 90°.

In some embodiments, one or more dielectric layers 120 are arranged over the second side 102b of the substrate 102 between the plurality of interior surfaces 118a-118b. In some embodiments, the one or more dielectric layers 120 may comprise an oxide, a nitride, a carbide, or the like. The angles of the plurality of interior surfaces 118a-118b increase absorption of radiation by the substrate 102 (e.g., by reducing a reflection of radiation from the uneven surface). For example, for incident radiation 122 (e.g., incident radiation having a wavelength that is in a near infrared portion of the electromagnetic spectrum) having an angle of incidence $\alpha_1$ greater than a critical angle, the plurality of interior surfaces 118a-118b may act to reflect the incident radiation 122 to another one of the plurality of interior surfaces 118a-118b, where the incident radiation 122 can be subsequently absorbed into the substrate 102. The plurality of interior surfaces 118a-118b may further act to reduce an angle of incidence for incident radiation 122 having a steep angle with respect to a top of the one or more dielectric layers 120, thereby preventing the incident radiation 122 from reflecting from the substrate 102.

The plurality of topographical features 118 provide the image sensing element 106 with a quantum efficiency (QE) that is comparable to an image sensor integrated chip having conical shaped protrusions (e.g., 42 at 850 nm). However, the plurality of interior surfaces 118a-118b have a lower concentration of defects (because they are formed using a wet etchant) than conical shaped protrusions, and thereby decrease dark current generation of the image sensing element 106 by a range of between approximately 80% and approximately 90% (e.g., from approximately 22.0 electrons per pixel per second (e-/p/s) to approximately 3.8 e-/p/s. Furthermore, the topographical features 118 are arranged within the pixel region at a greater homogeneity than that of conical protrusions achieved using a dry etching process, thereby decreasing a photo response non-uniformity (PNRU) by a range of between approximately 20% and approximately 80% (e.g., from 2.17 to 1.20).

Figure 2A:
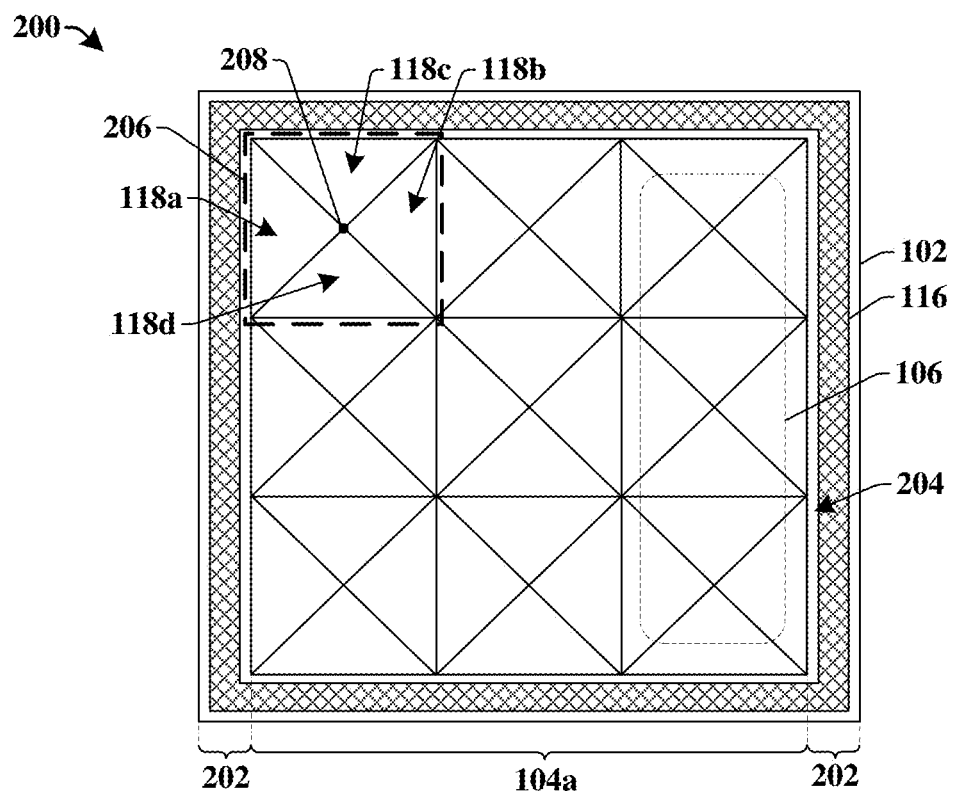
FIG. 2A illustrates a top-view of some embodiments of an image sensor integrated chip having an absorption enhancement structure defined by substantially flat surfaces.

FIG. 2A illustrates some additional embodiments of a top-view of an image sensor integrated chip 200.

The image sensor integrated chip 200 comprises a pixel region 104a surrounded by an isolation region 202. The isolation region 202 comprises an upper surface 204 of the substrate 102 and a BDTI structure 116 disposed within the upper surface 204. The upper surface 204 and the BDTI structure 116 continuously extend in an unbroken loop around the pixel region 104a and around a plurality of interior surfaces 118a-118d of the substrate 102 arranged directly over an image sensing element 106. In some embodiments, the upper surface 204 may comprise a substantially planar surface.

The plurality of interior surfaces 118a-118d comprise groups 206 of interior surfaces that define topographical features (e.g., pyramidal shaped protrusions and/or depressions) of the substrate 102. The groups 206 of interior surfaces comprise a plurality of interior surfaces 118a-118d, which respectively extend along planes (in a first direction and in a second direction that is perpendicular to the first direction) that intersect at a point 208. For example, in some embodiments, one of the groups 206 of interior surfaces 118a-118d may comprise a first surface 118a, a second surface 118b, a third surface 118c, and a fourth surface 118d. In various embodiments, the plurality of interior surfaces 118a-118d within a group 206 may define a topographical feature comprising a pyramidal protrusion extending outward from the substrate 102 or a pyramidal depression extending within the substrate 102. In some embodiments, the pyramidal protrusion and/or the pyramidal depression may have four interior surfaces and a substantially square shaped base.

Figure 2B:
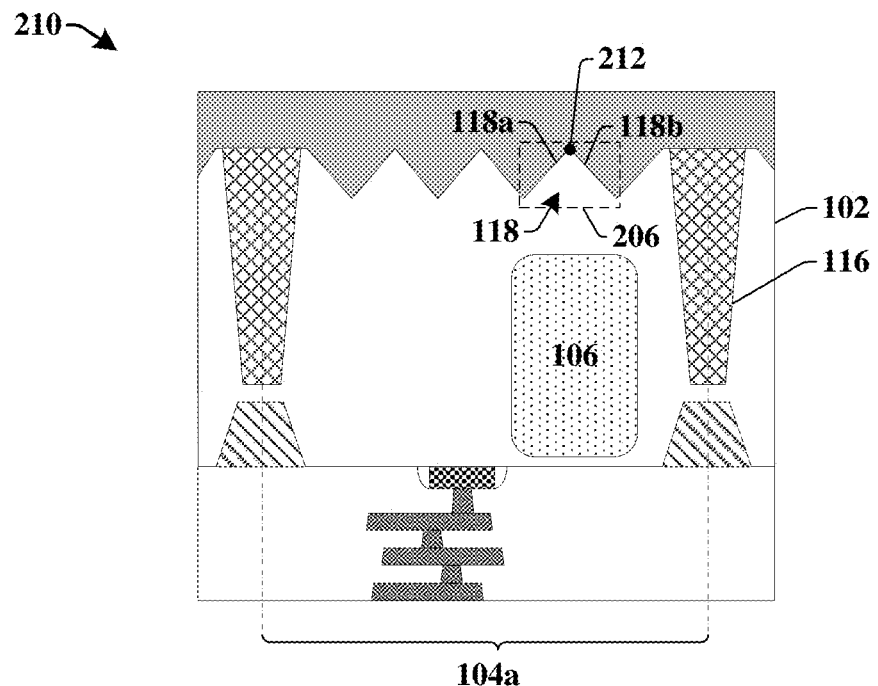
FIGS. 2B-2C illustrates cross-sectional views of some embodiments of an image sensor integrated chip having an absorption enhancement structure defined by substantially flat surfaces.

In some embodiments, the plurality of interior surfaces 118a-118d within one of the groups 206 may meet at a point comprising an apex 212 that is a highest point of the substrate 102 within the group. For example, FIG. 2B illustrates a cross-sectional view 210 of an image sensor integrated chip having a plurality of interior surfaces 118a-118b that meet at a point comprising an apex 212 within the group 206. In some such embodiments, the plurality of interior surfaces 118a-118b respectively have substantially flat surfaces comprising a width that decreases as a distance from the apex 212 decreases.

Figure 2C:
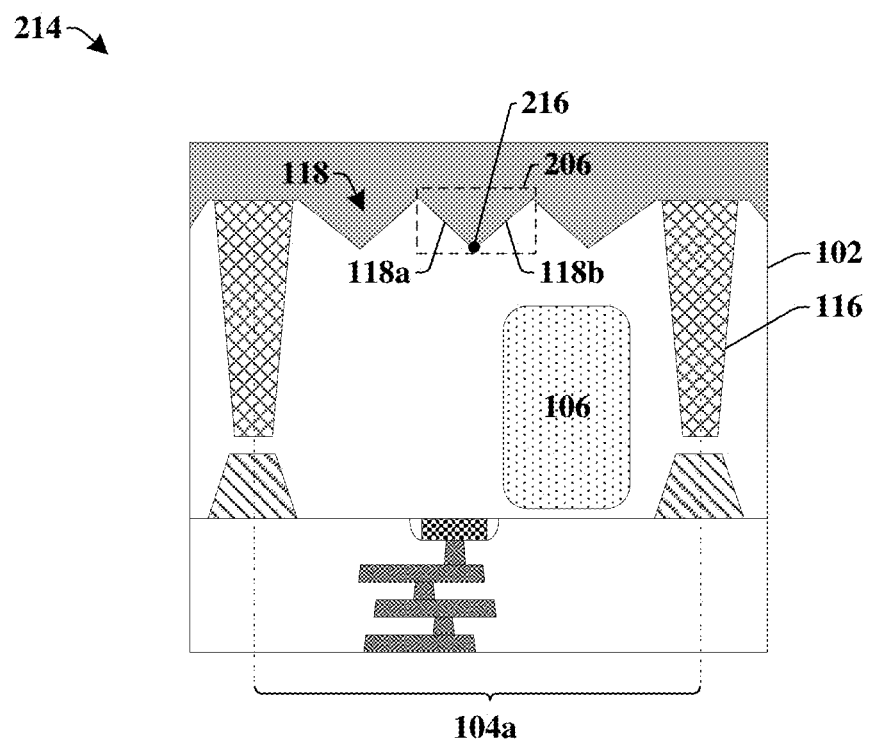

In other embodiments, the plurality of interior surfaces 118a-118d within one of the groups 206 may meet at a point comprising a nadir 216 that is that a lowest point of the substrate 102 within the group. For example, FIG. 2C illustrates a cross-sectional view 214 of an image sensor integrated chip having interior surfaces 118a-118b that meet at a point comprising a nadir 216 within the group 206. In some such embodiments, the interior surfaces 118a-118b respectively have substantially flat surfaces comprising a width that decreases as a distance from the nadir 216 decreases.

Figure 3:
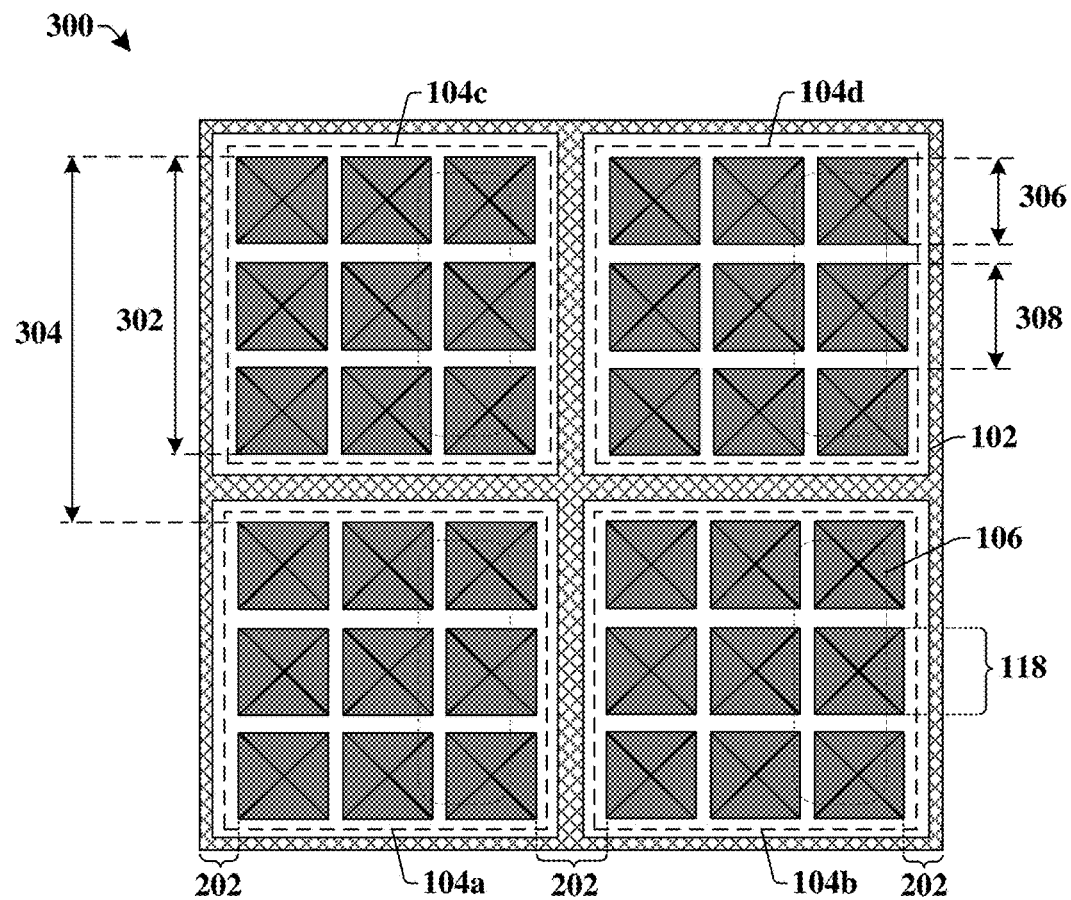
FIG. 3 illustrates a top-view of some embodiments of an image sensor integrated chip having an absorption enhancement structure defined by substantially flat surfaces.

FIG. 3 illustrates a top-view of some embodiments of an image sensor integrated chip 300 having an absorption enhancement structure defined by substantially flat surfaces.

The image sensor integrated chip 300 comprises a plurality of pixel regions 104a-104d respectively comprising an image sensing element 106. The plurality of pixel regions 104a-104d are separated by an isolation region 202. The plurality of pixel regions 104a-104d respectively have a width 302 and are arranged at a pitch 304. In some embodiments, the width 302 may be in a range of between approximately 1 micron (μm) and approximately 50 μm. In other embodiments, the width 302 may be less than 1 μm. In some embodiments, the pitch 304 may be in a range of between approximately 1 μm and approximately 50 μm. In other embodiments, the pitch 304 may be less than 1 μm. For example, in various embodiments, the pitch 304 may be approximately 628 nm, approximately 660 nm, approximately 470 nm, or approximately 728 nm.

The plurality of pixel regions 104a-104d respectively comprise a plurality of topographical features 118 (e.g., pyramidal shaped protrusions and/or depressions) arranged in rows and columns in an array. In some embodiments, the rows and/or columns may have a same number of topographical features 118. The plurality of topographical features 118 within the plurality of pixel regions 104a-104d respectively have a width 306 and are arranged at a pitch 308. In some embodiments, the width 306 may be in a range of between approximately 400 nm and approximately 1000 nm. In other embodiments, the width 306 may be in a range of between approximately 500 nm and approximately 10 um. In some embodiments, the pitch 308 may be in a range of between approximately 450 nm and approximately 900 nm. In some embodiments, a ratio of the width 306 to a pitch 308 may be in a range of between approximately 0.95 and approximately 1. In some embodiments, within respective ones of the plurality of pixel regions 104a-104d, the plurality of topographical features 118 may cover an area that is approximately 84% of a pixel region (i.e., a square of the width 306 divided by a square of the pitch 308 is approximately equal to 84%).

Figure 4:
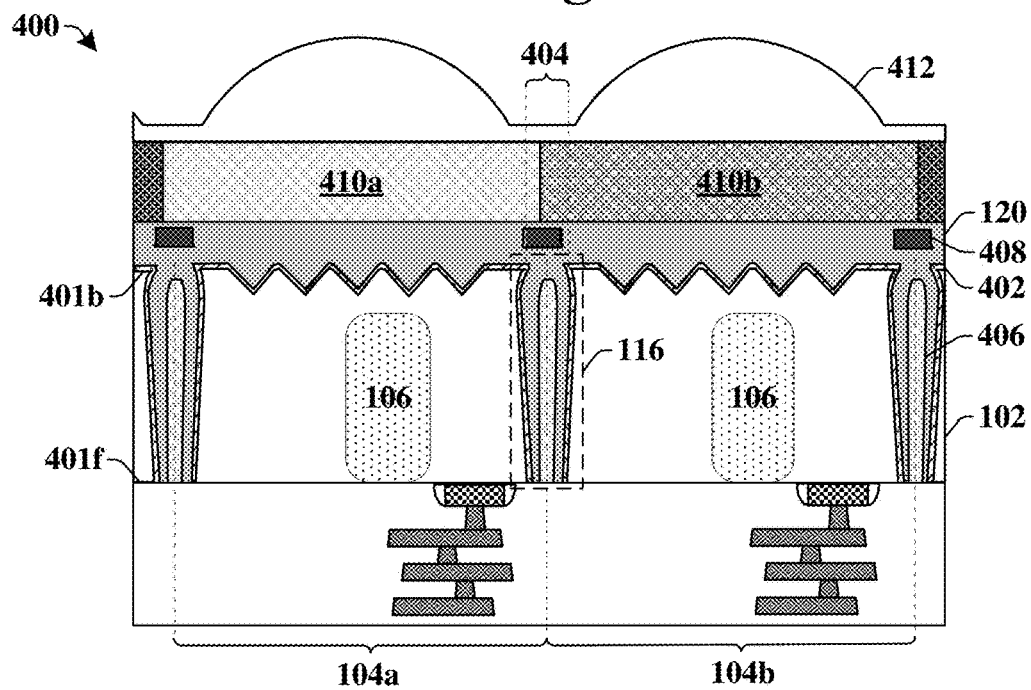
FIG. 4 illustrates a cross-sectional view of some embodiments of an image sensor integrated chip having an absorption enhancement structure defined by substantially flat surfaces.

FIG. 4 illustrates a cross-sectional view of some embodiments of an image sensor integrated chip 400 having an absorption enhancement structure defined by substantially flat surfaces.

The image sensor integrated chip 400 comprises a substrate 102 having a front-side 401f and a back-side 401b. A passivation layer 402 is arranged on the back-side 401b of the substrate 102. In some embodiments, the passivation layer 402 is arranged between the back-side 401b of the substrate 102 and one or more dielectric layers 120. In some embodiments, the passivation layer 402 may comprise a high-k dielectric material such as titanium aluminum oxide, hafnium tantalum oxide, zirconium lanthanum oxide, or the like. In some embodiments, the passivation layer 402 may be further arranged within trenches 404 defining back-side deep trench isolation (BDTI) structure 116. In some embodiments, the BDTI structures 116 further comprise the one or more dielectric layers 120 and one or more additional dielectric materials 406 (e.g., an oxide, a nitride, a carbide, or the like) confined within the trenches 404.

A grid structure 408 is disposed over the substrate 102 and within the one or more dielectric layers 120. The grid structure 408 comprises sidewalls that define openings overlying the pixel regions 104a-104b. In various embodiments, the grid structure 408 may comprise a metal (e.g., aluminum, cobalt, copper, silver, gold, tungsten, etc.) and/or a dielectric material (e.g., $SiO_2$, SiN, etc.). A plurality of color filters 410a-410b are arranged within the openings in the grid structure 408. The plurality of color filters 410a-410b are respectively configured to transmit specific wavelengths of incident radiation. A plurality of micro-lenses 412 are arranged over the plurality of color filters 410a-410b. The plurality of micro-lenses 412 are configured to focus the incident radiation (e.g., light) towards the pixel regions 104a-104b.

Figure 5A:
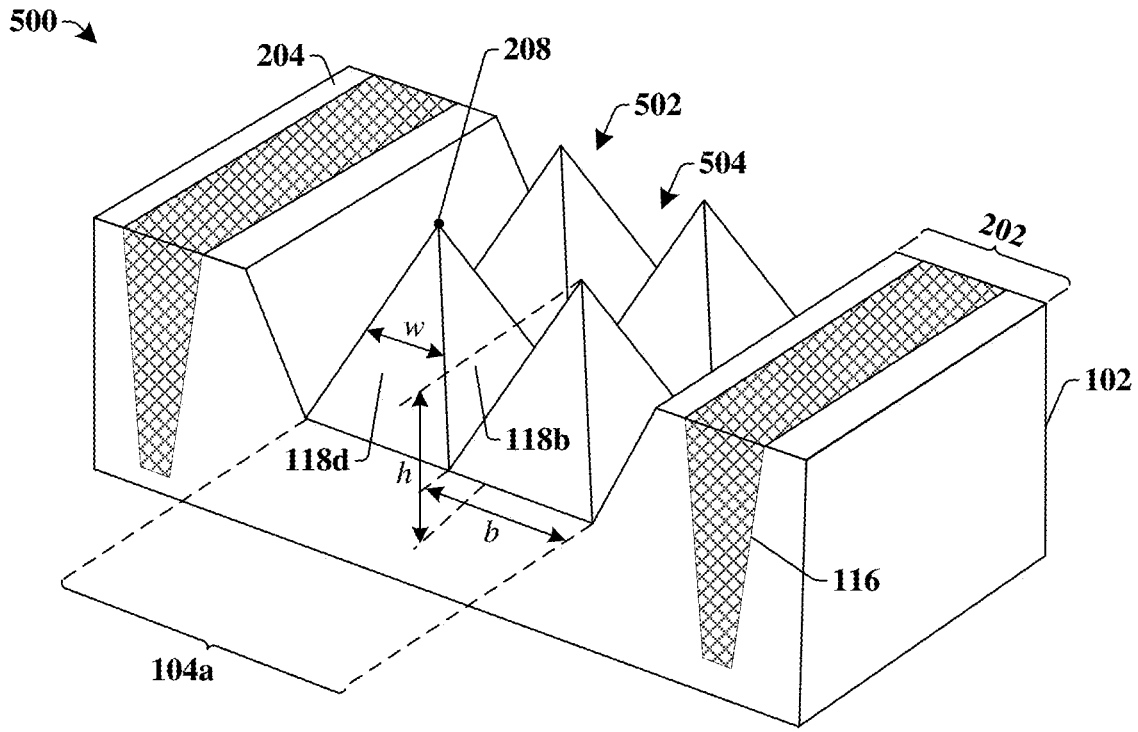
FIGS. 5A-5B illustrate some additional embodiments of an image sensor integrated chip having an absorption enhancement structure defined by substantially flat surfaces.
Figure 5B:
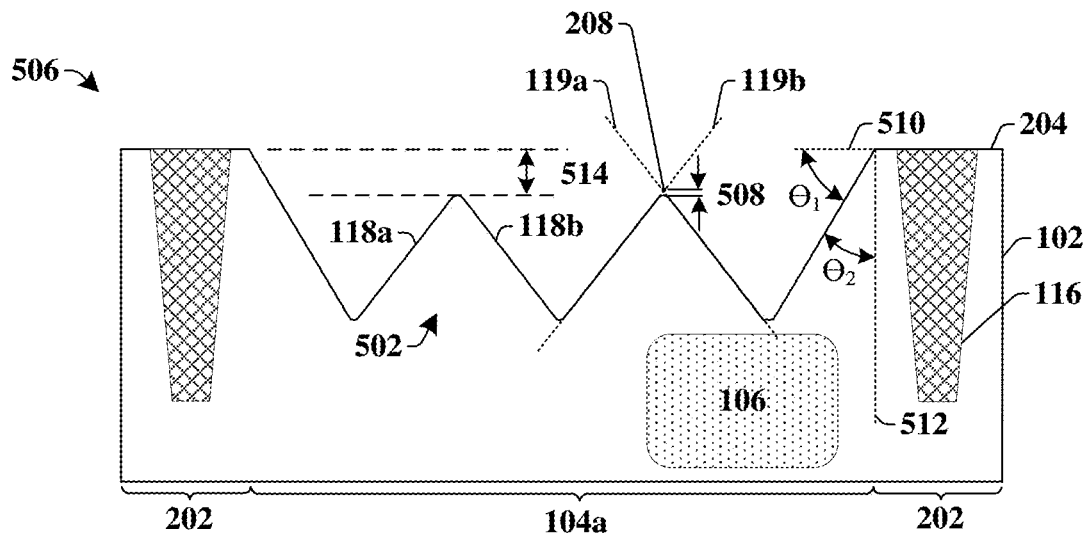

FIGS. 5A-5B illustrate some additional embodiments of an image sensor integrated chip having an absorption enhancement structure defined by substantially flat surfaces.

FIG. 5A illustrates a three-dimensional view 500 of an image sensor integrated chip. The image sensor integrated chip comprises a pixel region 104a having an image sensing element (not shown in FIG. 5A) arranged within a substrate

102. The substrate 102 comprises a plurality of interior surfaces, 118b and 118d, which define a plurality of pyramidal shaped protrusions 502 within the pixel region 104a. The plurality of interior surfaces, 118b and 118d, respectively comprise a substantially triangular shape that decreases in width w as a height h of the pyramidal shaped protrusions 502 increases. In some embodiments (shown in FIG. 5B), the pyramidal shaped protrusions 502 may have a rounded top or a flat top. The plurality of pyramidal shaped protrusions 502 respectively have a base (bottom) with a width b. In some embodiments, the height h may be approximately equal to 0.707b.

The plurality of pyramidal shaped protrusions 502 are separated by channels 504. In some embodiments, the channels 504 run in parallel directions along opposing sides of one of the plurality of pyramidal shaped protrusions 502. The pixel region 104a is surrounded by an isolation region 202 that is defined by an upper surface 204 of the substrate 102. In some embodiments, the channels 504 run in lines between sidewalls defining the isolation region 202.

FIG. 5B illustrates a cross-sectional view 506 of the image sensor integrated chip of FIG. 5A. The image sensor integrated chip comprises a plurality of interior surfaces 118a-118b. The plurality of interior surfaces 118a-118b extend along planes 119a-119b that intersect at a point 208. In some embodiments, the point 208 is separated from (e.g., arranged above) the substrate 102 by a distance 508 that is in a range of between approximately 0 nm and approximately 30 nm. In some embodiments, the plurality of pyramidal shaped protrusions 502 have tops that are recessed below the upper surface 204 of the isolation region 202 by a distance 514. In some embodiments, the distance 514 may be in a range of between approximately 10 nm and approximately 100 nm. For example, in some embodiments, the distance 514 may be approximately equal to 29.6 nm.

In some embodiments, the plurality of interior surfaces 118a-118b are respectively oriented at a first angle $\theta_1$ with respect to a first plane 510 extending along the upper surface 204 of the substrate 102. In such embodiments, the plurality of interior surfaces 118a-118b are respectively oriented at a second angle $\theta_2$ with respect to a second plane 512 that is perpendicular to the upper surface 204 of the substrate 102. In some embodiments, the first angle $\theta_1$ may be approximately 35.3°. In some embodiments, second angle $\theta_2$ may be approximately 54.7°.

Figure 6A:
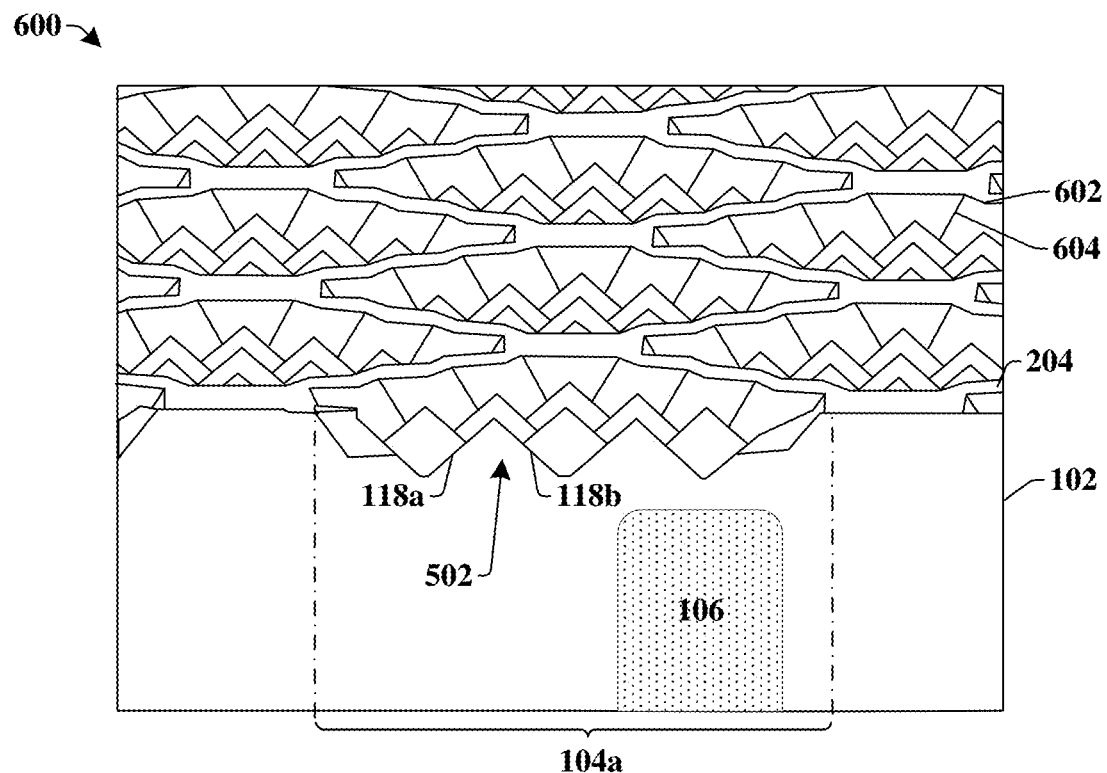
FIGS. 6A-6B illustrate some additional embodiments of an image sensor integrated chip having an absorption enhancement structure defined by substantially flat surfaces.
Figure 6B:
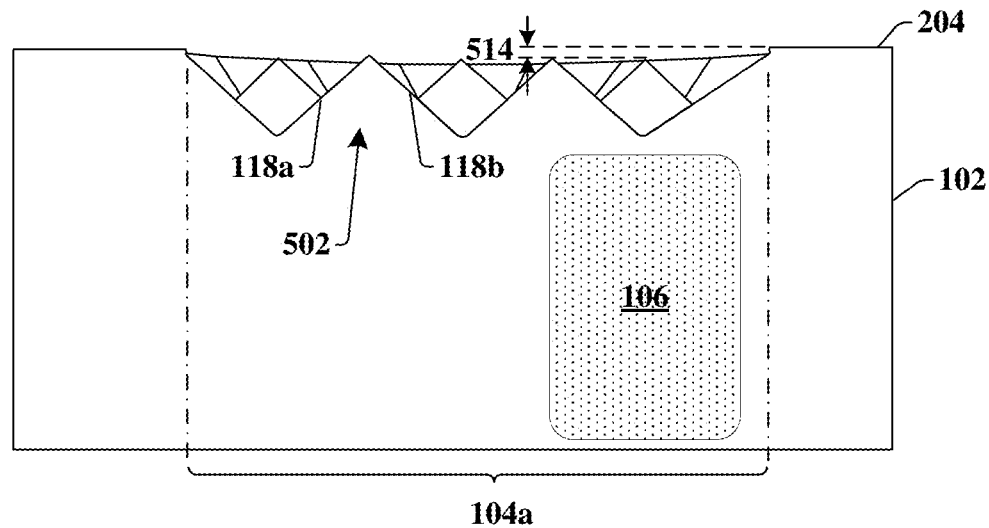

FIG. 6A illustrate a three-dimensional view 600 of some additional embodiments of an image sensor integrated chip having an absorption enhancement structure defined by substantially flat surfaces. FIG. 6B illustrate a cross-sectional view 606 of the image sensor integrated chip of FIG. 6A.

The image sensor integrated chip comprises a pixel region 104a having a plurality of pyramidal shaped protrusions 502. An upper surface 204 of the substrate 102 is defined by jagged edges 602 as viewed from a top-view. Adjacent ones of the jagged edges 602 meet along a groove 604 that extends along sides of the substrate 102. Although not illustrated in FIG. 6A, it will be appreciated that a BDTI structure may be arranged within the upper surface 204 of the substrate 102 surrounding the pixel region 104a.

Figure 7A:
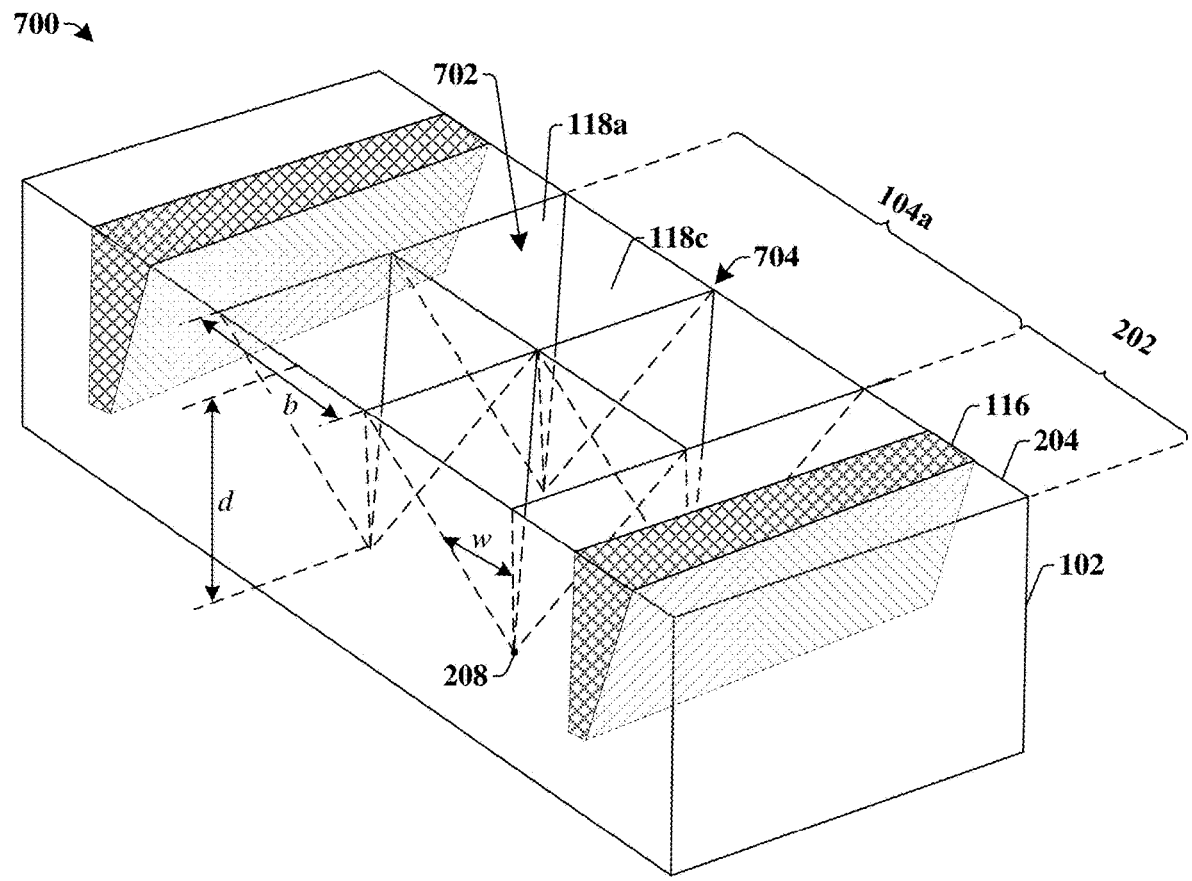
FIGS. 7A-7B illustrate some additional embodiments of an image sensor integrated chip having an absorption enhancement structure defined by substantially flat surfaces.
Figure 7B:
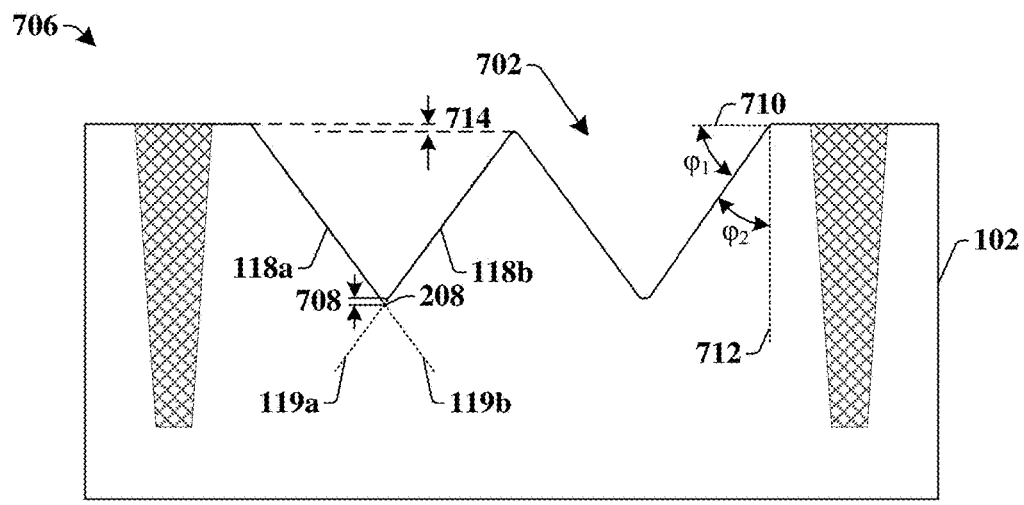

FIGS. 7A-7B illustrate some additional embodiments of an image sensor integrated chip having an absorption enhancement structure defined by substantially flat surfaces.

FIG. 7A illustrates a three-dimensional view 700 of an image sensor integrated chip. The image sensor integrated chip comprises a pixel region 104a having an image sensing element (not shown in FIG. 7A) arranged within a substrate 102. The substrate 102 comprises a plurality of interior surfaces, 118b and 118c, which define a plurality of pyramidal shaped depressions 702 within the pixel region 104a. The plurality of interior surfaces, 118b and 118c, respectively comprise a substantially triangular shape that decreases in width w as a depth d of the plurality of pyramidal shaped depressions 702 increase. In some embodiments (shown in FIG. 7B), the plurality of pyramidal shaped depressions 702 may have a rounded bottom or a flat bottom. The plurality of pyramidal shaped depressions 702 respectively have a base (top) with a width b. In some embodiments, the depth d may be approximately equal to 0.707b.

The plurality of pyramidal shaped depressions 702 are separated by ridges 704. In some embodiments, the ridges 704 run in parallel directions along opposing sides of one of the plurality of pyramidal shaped depressions 702. The pixel region 104a is surrounded by an isolation region 202 that is defined by an upper surface 204 of the substrate 102. In some embodiments, the ridges 704 run in lines between sidewalls defining the isolation region 202.

FIG. 7B illustrates a cross-sectional view 706 of an image sensor integrated chip. The image sensor integrated chip comprises a plurality of interior surfaces 118a-118b. The plurality of interior surfaces 118a-118b extend along planes 119a-119b that intersect at a point 208. In some embodiments, the point 208 is separated from (e.g., arranged below) one of the plurality of pyramidal shaped depressions 702 by a distance 708 that is in a range of between approximately 0 nm and approximately 30 nm. In some embodiments, the plurality of interior surfaces 118a-118b are respectively oriented at a first angle $\Phi_1$ with respect to a first plane 710 extending along the upper surface 204 of the substrate 102. In such embodiments, the plurality of interior surfaces 118a-118b are respectively oriented at a second angle $\Phi_2$ with respect to a second plane 712 that is perpendicular to the upper surface 204 of the substrate 102. In some embodiments, the first angle $\Phi_1$ may be approximately 35.3°. In some embodiments, second angle $\theta_2$ may be approximately 54.7°.

In some embodiments, the plurality of pyramidal shaped depressions 702 have tops that are recessed below the upper surface 204 of the isolation region 202 by a distance 714. In some embodiments, the distance 714 may be in a range of between approximately 5 nm and approximately 40 nm.

Figure 8A:
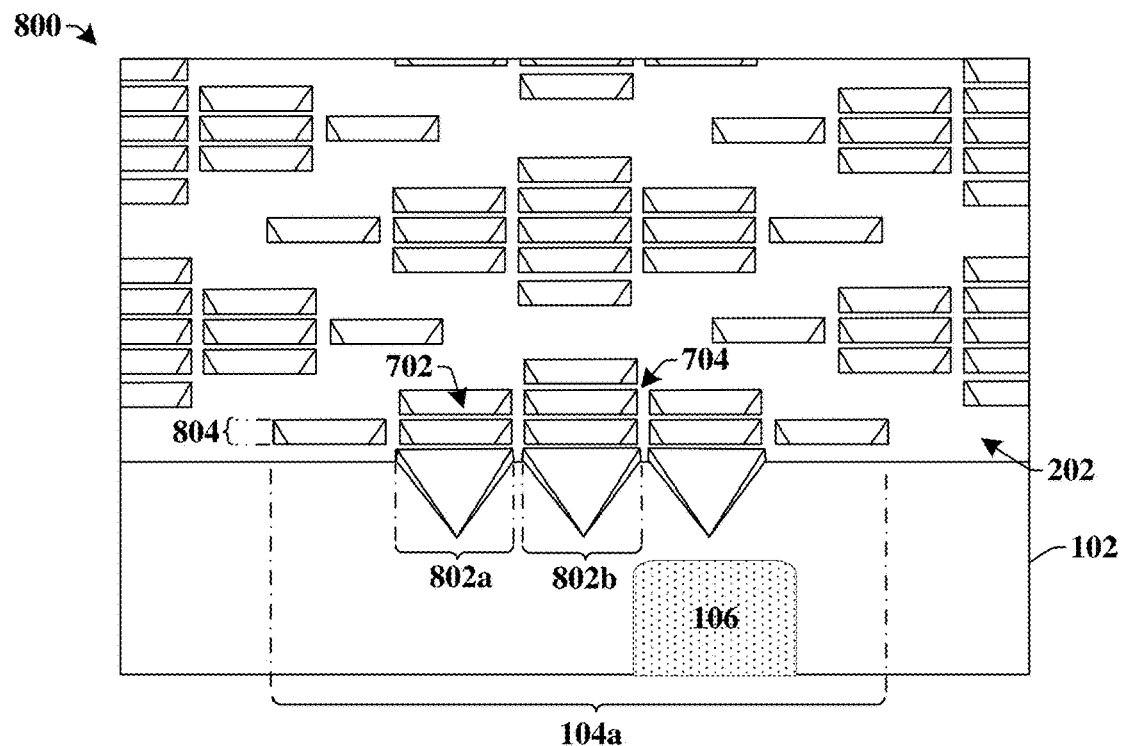
FIGS. 8A-8B illustrate some additional embodiments of an image sensor integrated chip having an absorption enhancement structure defined by substantially flat surfaces.
Figure 8B:
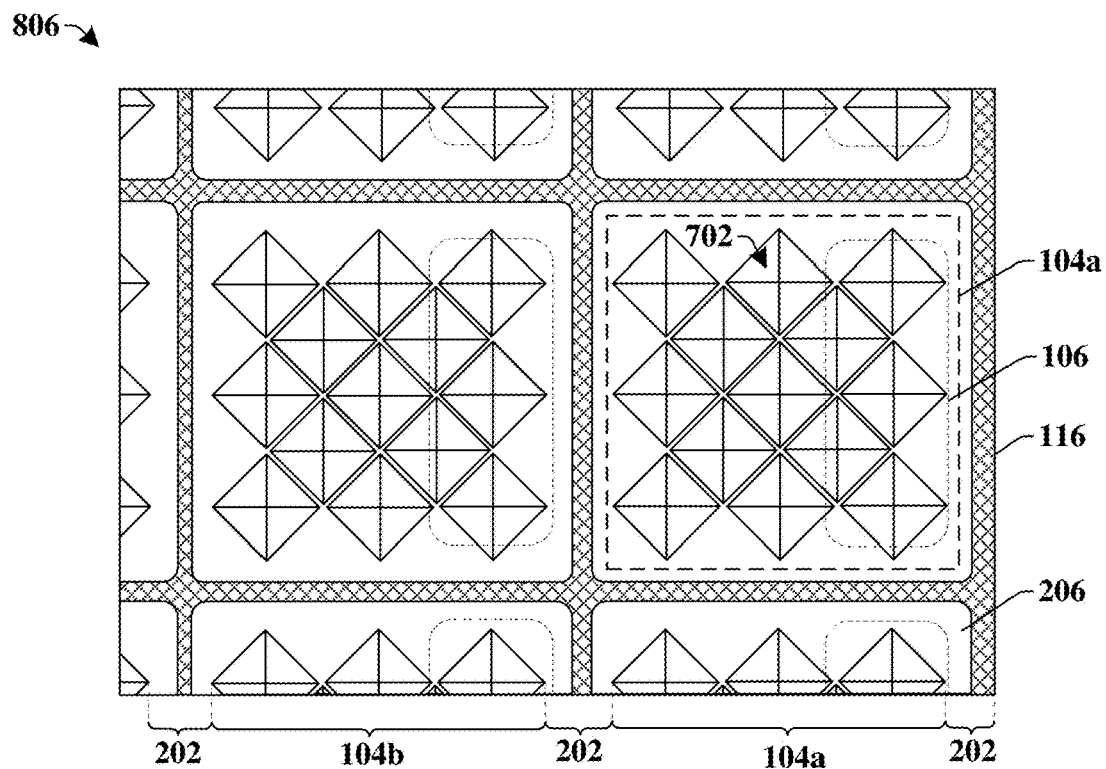

FIG. 8A illustrate a three-dimensional view of some additional embodiments of an image sensor integrated chip 800 having an absorption enhancement structure defined by substantially flat surfaces. FIG. 8B illustrate a top-view 806 of the image sensor integrated chip 800 of FIG. 8A. Although not illustrated in FIG. 8A, it will be appreciated that a BDTI structure may be arranged within the upper surface 204 of the substrate 102 surrounding the pixel region 104a.

The image sensor integrated chip 800 comprises a pixel region 104a having a plurality of pyramidal shaped depressions 702 arranged in rows 802a-802b and columns 804. In some embodiments, a first row 802a has a first number of pyramidal shaped depressions 702 and a second row 802b has a second number of pyramidal shaped depressions 702 that is different than the first number.

FIGS. 9-18 illustrate cross-sectional views 900-1800 of some embodiments of a method of forming an image sensor integrated chip having an absorption enhancement structure defined by substantially flat surfaces. Although the cross-sectional views 900-1800 shown in FIGS. 9-18 are described with reference to a method of forming an image sensor integrated chip having an absorption enhancement structure defined by substantially flat surfaces, it will be appreciated that the structures shown in FIGS. 9-18 are not limited to the method of formation but rather may stand alone separate of the method. Furthermore, although the method describes the formation of a back-side illuminated (BSI) image sensor, it will be appreciated that the disclosed absorption enhancement apparatus may also be applied to front-side illuminated (FSI) image sensors.

Figure 9:
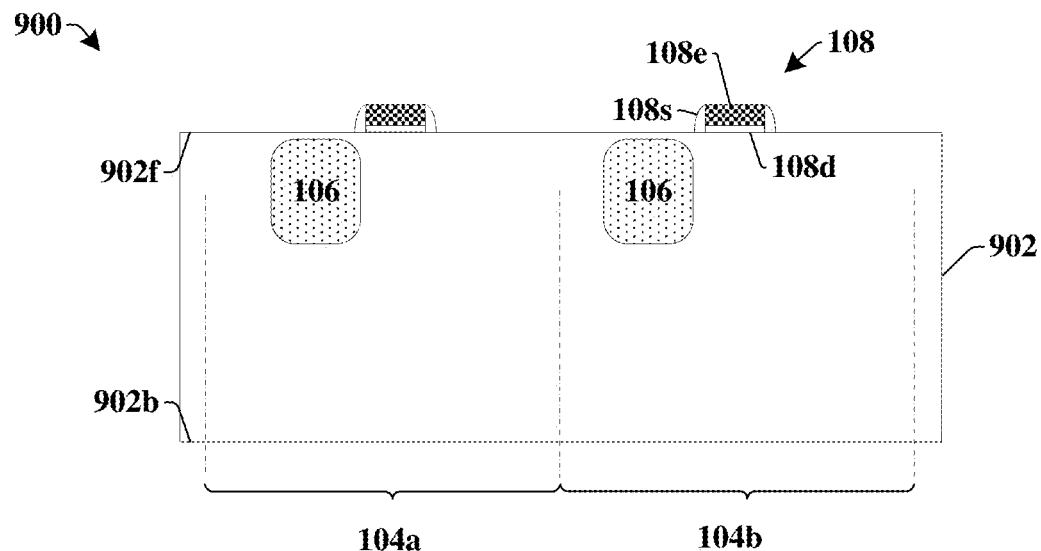
FIGS. 9-18 illustrate cross-sectional views of some embodiments of a method of forming an image sensor integrated chip having an absorption enhancement structure defined by substantially flat surfaces.

As shown in cross-sectional view 900 of FIG. 9, one or more transistor gate structures 108 are formed along a front-side 902f of a substrate 902 within pixel regions 104a-104b. The substrate 902 may be any type of semiconductor body (e.g., silicon, SiGe, SOI, etc.), as well as any other type of semiconductor and/or epitaxial layers, associated therewith. For example, in some embodiments, the substrate 902 may comprise a base substrate and an epitaxial layer. In various embodiments, the one or more transistor gate structures 108 may correspond to a transfer transistor, a source-follower transistor, a row select transistor, and/or a reset transistor. In some embodiments, the one or more transistor gate structures 108 may be formed by depositing a gate dielectric film and a gate electrode film on the front-side 902f of the substrate 902. The gate dielectric film and the gate electrode film are subsequently patterned to form a gate dielectric layer 108d and a gate electrode 108e. Sidewall spacers 108s may be formed on the outer sidewalls of the gate electrode 108e. In some embodiments, the sidewall spacers 108s may be formed by depositing a spacer layer (e.g., a nitride, an oxide, etc.) onto the front-side 902f of the substrate 902 and selectively etching the spacer layer to form the sidewall spacers 108s.

Image sensing elements 106 are formed within the pixel regions 104a-104b of the substrate 902. In some embodiments, the image sensing elements 106 may comprise photodiodes formed by implanting one or more dopant species into the front-side 902f of the substrate 902. For example, the photodiodes may be formed by selectively performing a first implantation process (e.g., according to a masking layer) to form a first region having a first doping type (e.g., n-type), and subsequently performing a second implantation process to form a second region abutting the first region and having a second doping type (e.g., p-type) different than the first doping type. In some embodiments a floating diffusion well (not shown) may also be formed using one of the first or second implantation processes.

Figure 10:
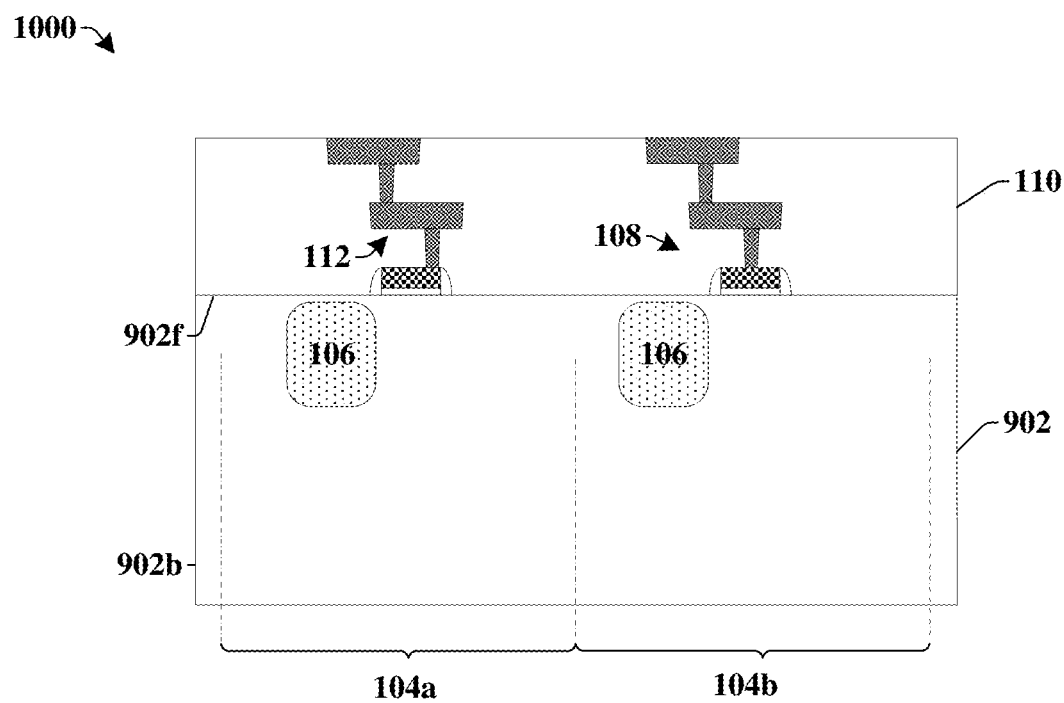

As shown in cross-sectional view 1000 of FIG. 10, a plurality of conductive interconnect layers 112 are formed within a dielectric structure 110 formed along the front-side 902f of the substrate 902. The dielectric structure 110 comprises a plurality of stacked ILD layers, while the plurality of conductive interconnect layers 112 comprise alternating layers of conductive wires and vias. In some embodiments, one or more of the plurality of conductive interconnect layers 112 may be formed using a damascene process (e.g., a single damascene process or a dual damascene process). The damascene process is performed by forming an ILD layer over the front-side 902f of the substrate 902, etching the ILD layer to form a via hole and/or a trench, and filling the via hole and/or trench with a conductive material. In some embodiments, the ILD layer may be deposited by a physical vapor deposition technique (e.g., PVD, CVD, PE-CVD, ALD, etc.) and the conductive material may be formed using a deposition process and/or a plating process (e.g., electroplating, electro-less plating, etc.). In various embodiments, the plurality of conductive interconnect layers 112 may comprise tungsten, copper, or aluminum copper, for example.

Figure 11:
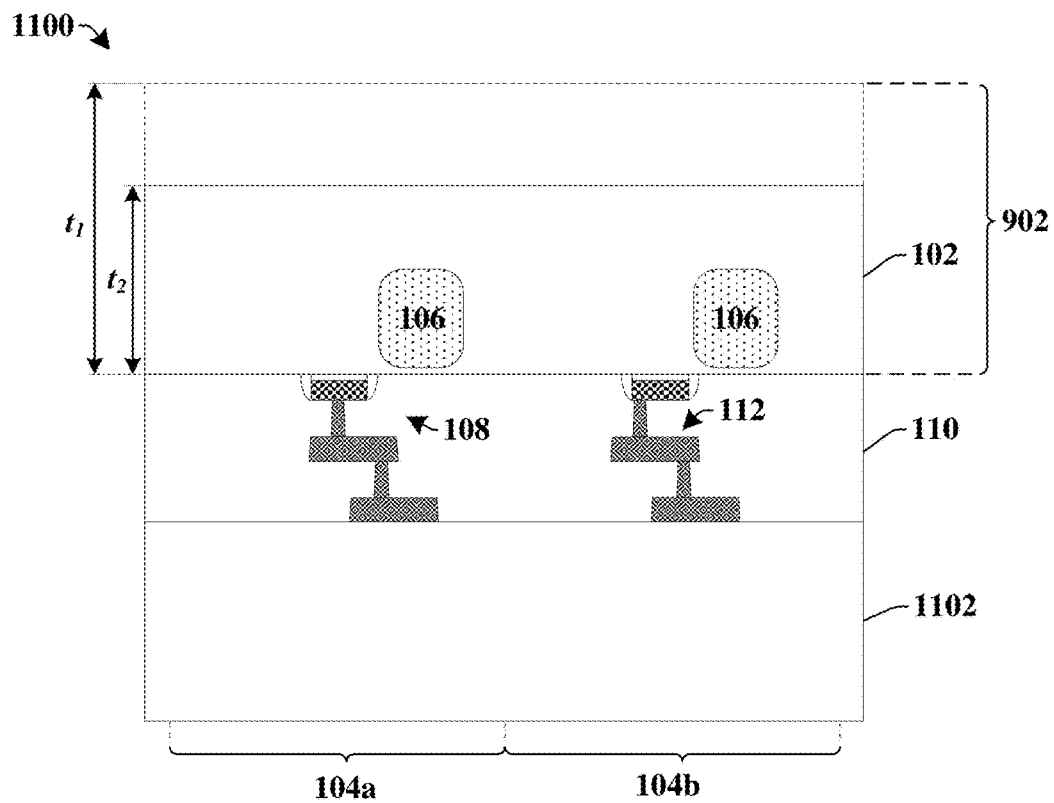

As shown in cross-sectional view 1100 of FIG. 11, the dielectric structure 110 may be bonded to a support substrate 1102. In some embodiments, the support substrate 1102 may comprise a semiconductor material, such as silicon. After bonding the dielectric structure 110 to the support substrate 1102, the substrate 902 may be thinned to form substrate 102. Thinning the substrate 902 reduces a thickness of the substrate from a first thickness $t_1$ to a second thickness $t_2$ that is less than the first thickness $t_1$. Thinning the substrate 902 allows for radiation to pass more easily to the image sensing elements 106. In various embodiments, the substrate 902 may be thinned by etching and/or mechanical grinding a back-side 902b of the substrate 902.

Figure 12:
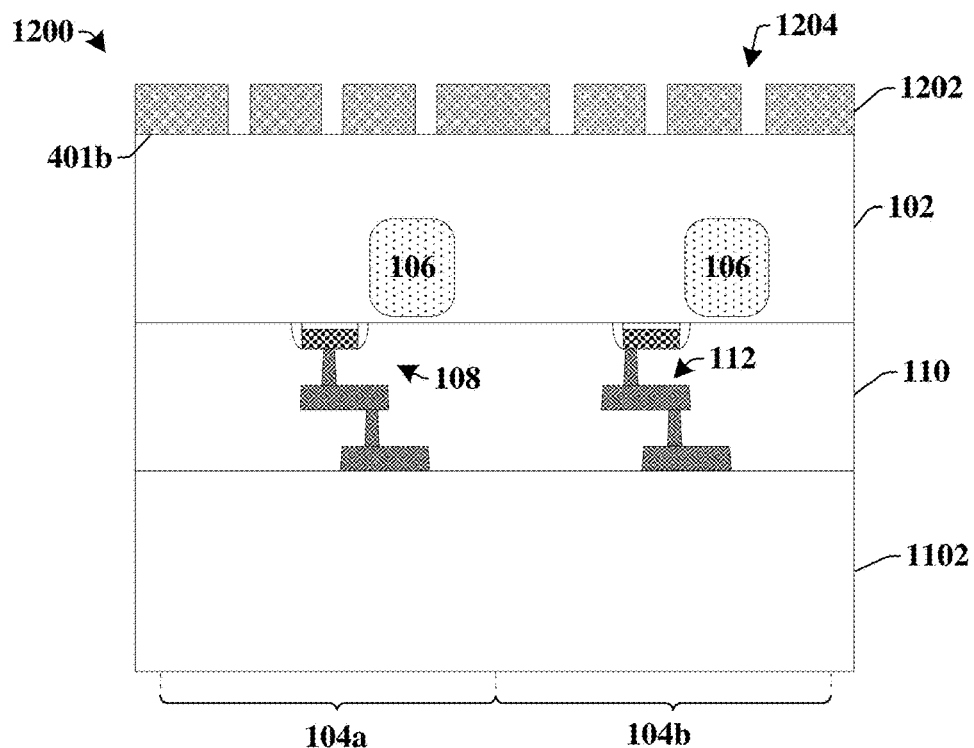

As shown in cross-sectional view 1200 of FIG. 12, a first patterned masking layer 1202 is formed along a back-side 401b of the substrate 102. The first patterned masking layer 1202 comprises sidewalls defining openings 1204 along the back-side 401b of the substrate 102. In some embodiments, the first patterned masking layer 1202 may comprise a hard mask including titanium, silicon carbide, silicon oxy-nitride, tantalum, or the like. In some embodiments, the first patterned masking layer 1202 may be deposited over the back-side 401b of the substrate 102 and subsequently patterned using a photolithography process and a dry etching process.

Figure 13:
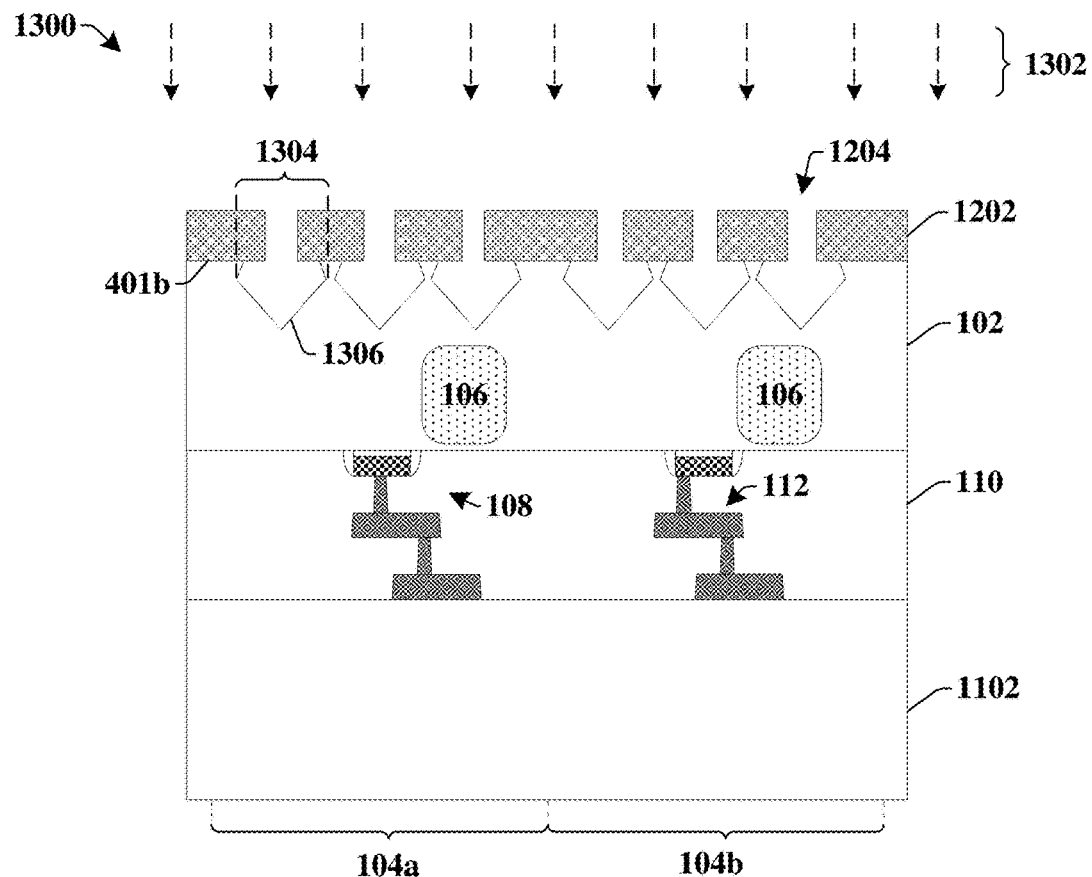

As shown in cross-sectional view 1300 of FIG. 13, a first wet etching process is performed on the back-side 401b of the substrate 102 according to the first patterned masking layer 1202. The first wet etching process is performed by selectively exposing the back-side 401b of the substrate 102 to one or more first wet etchants 1302 according to the first patterned masking layer 1202. The one or more first wet etchants 1302 remove parts of the substrate 102 to form a plurality of recesses 1304 defined by interior surfaces 1306 of the substrate 102. In some embodiments, the one or more first wet etchants 1302 may comprise hydroflouric acid (HF), tetramethylammonium hydroxide (TMAH), potassium hydroxide (KOH), or the like.

Figure 14A:
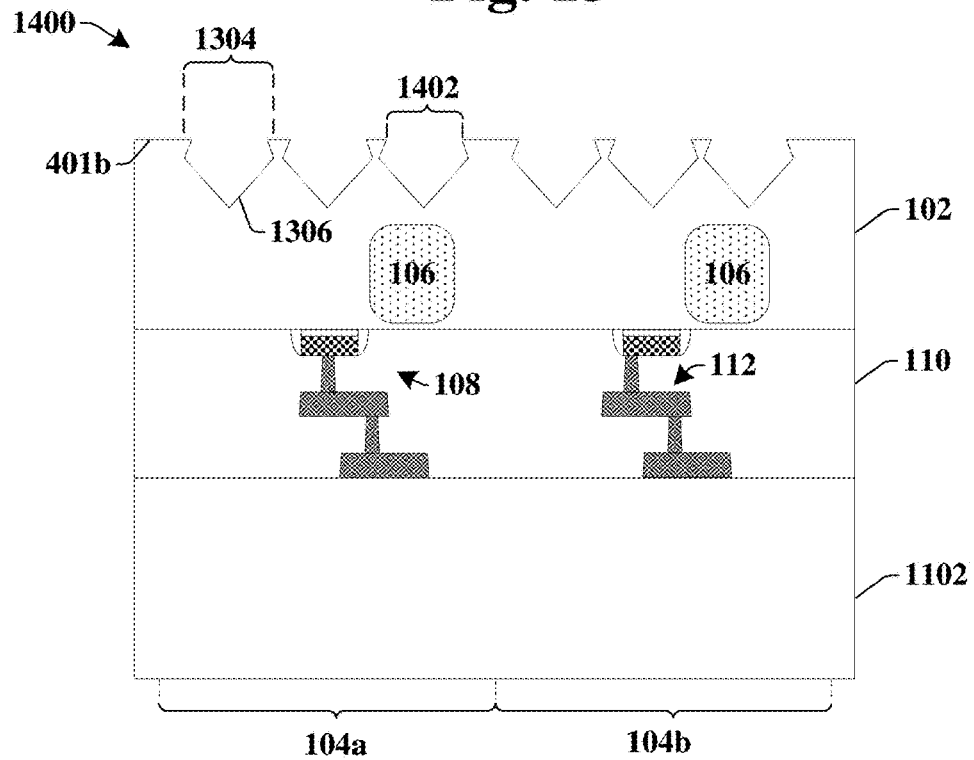
Figure 14B:
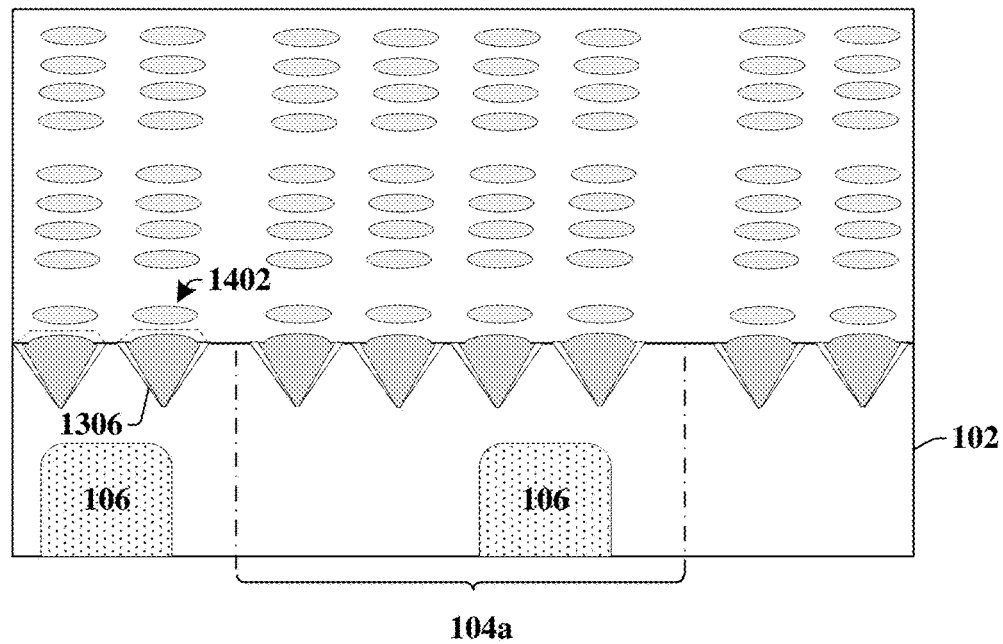

As shown in cross-sectional view 1400 of FIG. 14A, the first patterned masking layer (1202 of FIG. 13) is removed. Removal of the first patterned masking layer (1202 of FIG. 13) results in an aperture 1402 extending between the back-side 401b of the substrate 102 and the plurality of recesses 1304. As shown in three-dimensional view 1404 of FIG. 14B, in some embodiments, the aperture 1402 may comprise a circular aperture.

Figure 15:
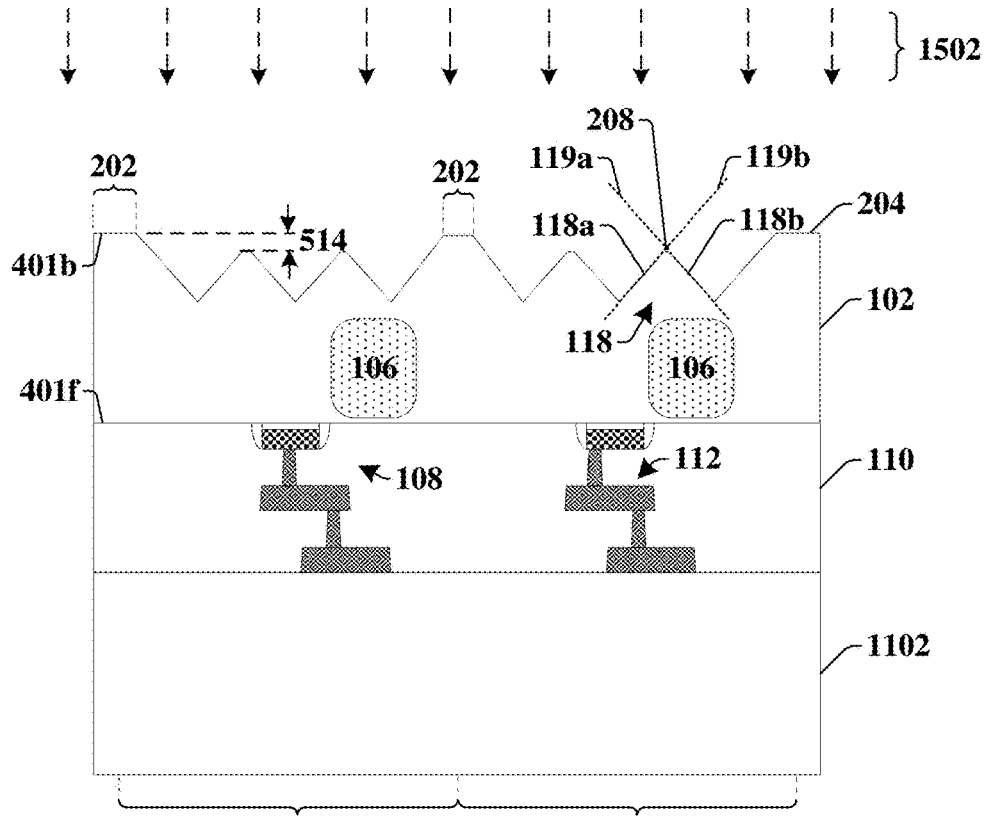

As shown in cross-sectional view 1500 of FIG. 15, a second wet etching process is performed on the back-side 401b of the substrate 102. The second wet etching process is performed by exposing the substrate 102 to one or more second wet etchants 1502, which remove upper portions of the substrate 102. Removing the upper portions of the substrate 102 defines topographical features 118 within a pixel region 104a of the substrate 102. Since the second wet etching process removes upper portions of the substrate 102, tops of the topographical features 118 may be recessed below an upper surface 204 of the substrate 102 by a distance 514. The topographical features 118 are defined by a plurality of interior surfaces 118a-118b comprising substantially flat surfaces extending along planes 119a-119b that intersect at a point 208. In some embodiments, the topographical features 118 may comprise pyramidal shaped protrusions and the planes 119a-119b may meet at points that are along tops of the topographical features 118 or that are over the topographical features 118. In other embodiments, the topographical features 118 may comprise pyramidal shaped depressions and the planes 119a-119b may meet at points that are along bottoms of the topographical features 118 or that are below the topographical features 118. Removing the upper portions of the substrate 102 also defines an isolation region 202 surrounding the plurality of interior surfaces 118a-118b. The isolation region 202 is defined by an upper surface 204. In some embodiments, the upper surface 204 is a substantially planar surface disposed along a plane that overlies the plurality of interior surfaces 118a-118b by one or more non-zero distances.

In some embodiments, the one or more second wet etchants 1502 may comprise hydroflouric acid (HF), tetramethylammonium hydroxide (TMAH), potassium hydroxide (KOH), or the like. Using wet etching processes to form the plurality of interior surfaces 118a-118b defining the topographical features 118 avoids plasma damage (e.g., reduces crystalline defects) that may occur using dry etching processes. Furthermore, the wet etching processes can provide for a high degree of anisotropy, which etches along crystalline planes and provides for good uniformity of the topographical features 118 within the pixels regions 104a-104b. For example, in some embodiments, the substrate 102 may comprise silicon and the one or more first wet etchants 1302 and/or the one or more second wet etchants 1502 may etch the (100) plane to form interior surfaces 118a-118b defined by the (111) planes (i.e., and to form a recess bound by (111) planes). In such embodiments, the angle between the interior surfaces 118a-118b and the (100) plane is approximately equal to 54.7°.

Figure 16:
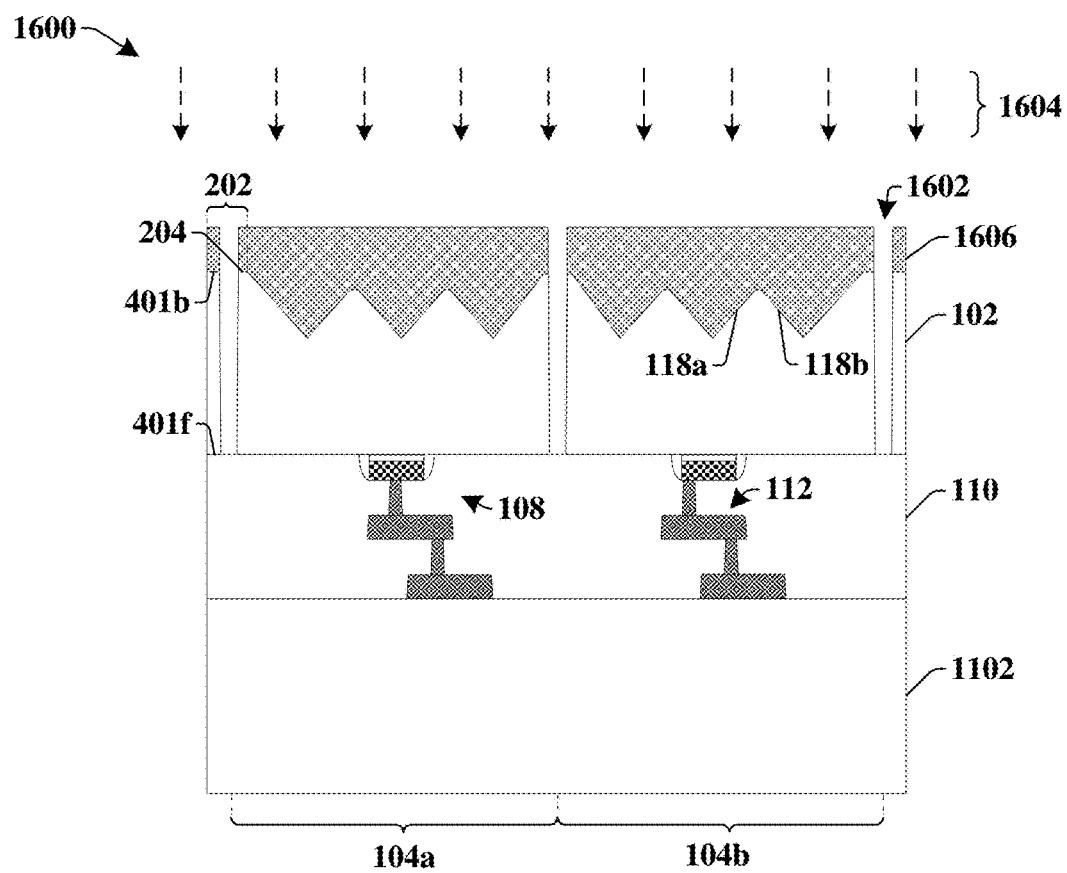

As shown in cross-sectional view 1600 of FIG. 16, trenches 1602 are formed within the back-side 401b of the substrate 102 within the isolation region 202. The trenches 1602 vertically extend from the upper surface 204 to within the substrate 102 at locations laterally between the plurality of pixel regions 104a-104b. In some embodiments, the trenches 1602 may be formed by exposing the back-side 401b of the substrate 102 to a third etching process. The third etching process is performed by selectively exposing the back-side 401b of the substrate 102 to one or more third etchants 1604 according to a second patterned masking layer 1606. In some embodiments, the second patterned masking layer 1606 may comprise photoresist. In some embodiments, the one or more third etchants 1604 may comprise a dry etchant. In some embodiments, the dry etchant may have an etching chemistry comprising one or more of oxygen ($O_2$), nitrogen ($N_2$), hydrogen ($H_2$), argon (Ar), and/or a fluorine species (e.g., $CF_4$, $CHF_3$, $C_4F_8$, etc.).

Figure 17:
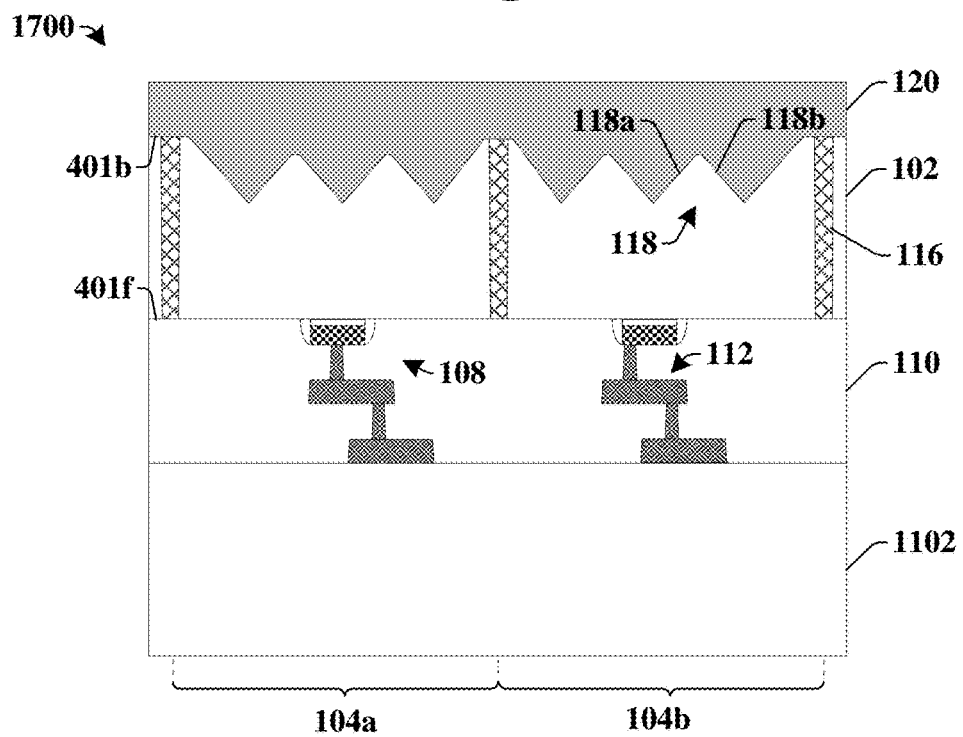

As shown in cross-sectional view 1700 of FIG. 17, one or more first dielectric materials are formed within the trenches 1602 to form back-side deep trench isolation (BDTI) structures 116 on opposing sides of the pixel regions 104a-104b. One or more dielectric layers 120 are also formed over the plurality of interior surfaces 118a-118b and the upper surface 204 of the substrate 102. In some embodiments, the one or more first dielectric materials and the one or more dielectric layers 120 may comprise a same material formed using a single continuous deposition process and/or multiple deposition processes performed in-situ. In other embodiments, the one or more first dielectric materials and the one or more dielectric layers 120 may comprise different materials formed using different deposition processes.

In various embodiments, the one or more first dielectric materials may comprise an oxide, a nitride, a carbide, or the like. In various embodiments, the one or more dielectric layers 120 may comprise an oxide (e.g., silicon oxide), TEOS, etc. In some embodiments, the one or more dielectric layers 120 may extend between adjacent ones of the plurality of topographical features 118. In some embodiments, the one or more dielectric layers 120 may be deposited to have an upper surface comprising a plurality of curved surfaces arranged over the topographical features 118 and intersecting one another. In some embodiments, the plurality of curved surfaces may be removed by a subsequent planarization process (e.g., a chemical mechanical planarization process) to give the one or more dielectric layers 120 a substantially planar upper surface.

In some embodiments, a passivation layer (not shown) may be formed along the back-side 401b of the substrate 102 prior to the formation of the BDTI structures 116 and/or the one or more dielectric layers 120. The passivation layer lines the back-side 401b of the substrate 102. In some embodiments, the passivation layer may further line interior sidewalls of the trenches (1602 of FIG. 16). In some embodiments, the passivation layer may comprise a high-k dielectric layer including hafnium oxide ($HfO_2$), titanium oxide ($TiO_2$), hafnium zirconium oxide (HfZrO), tantalum oxide ($Ta_2O_3$), hafnium silicon oxide ($HfSiO_4$), zirconium oxide ($ZrO_2$), zirconium silicon oxide ($ZrSiO_2$), etc. In some embodiments, the passivation layer may be deposited by a physical vapor deposition technique (e.g., PVD, CVD, PE-CVD, ALD, etc.).

Figure 18:
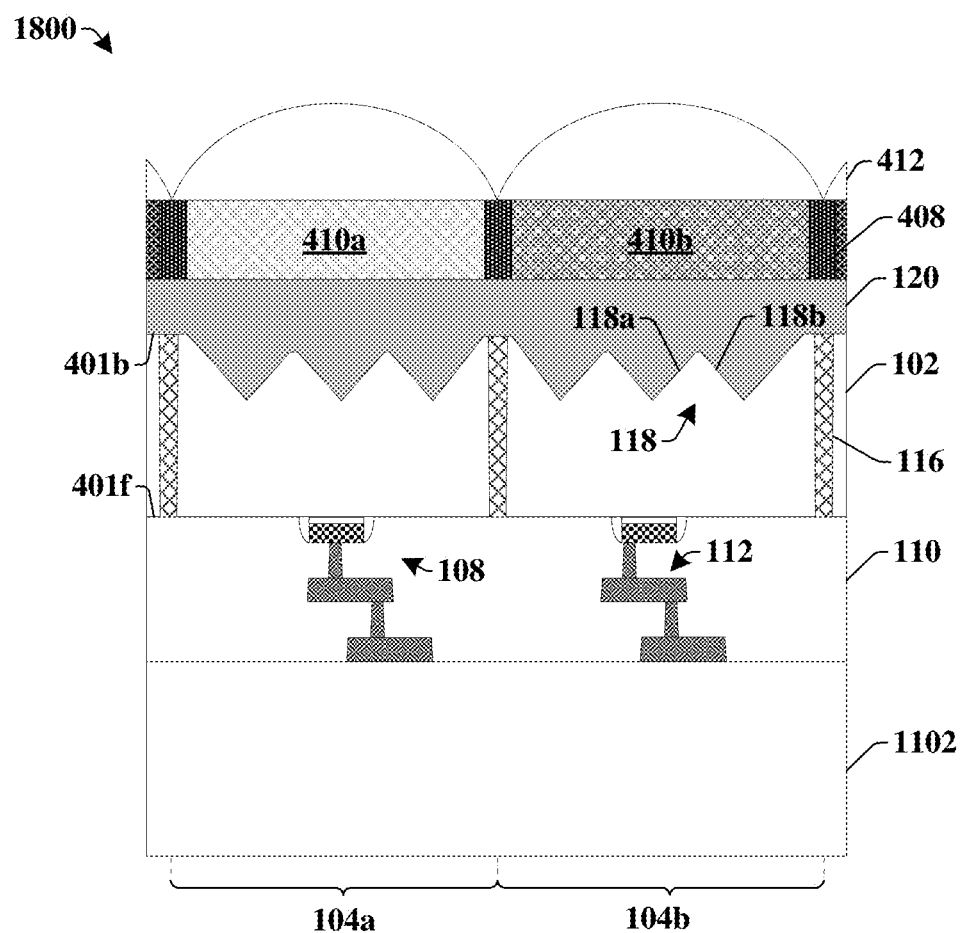

As shown in cross-sectional view 1800 of FIG. 18, a plurality of color filters 410a-410b are formed over the one or more dielectric layers 120. In some embodiments, the plurality of color filters 410a-410b may be formed within openings in a grid structure 408 overlying the one or more dielectric layers 120. In some embodiments, the plurality of color filters 410a-410b may be formed by forming a color filter layer and patterning the color filter layer. The color filter layer is formed of a material that allows for the transmission of radiation (e.g., light) having a specific range of wavelength, while blocking light of wavelengths outside of the specified range.

A plurality of micro-lenses 412 are formed over the plurality of color filters 410a-410b. In some embodiments, the plurality of micro-lenses 412 may be formed by depositing a micro-lens material above the plurality of color filters (e.g., by a spin-on method or a deposition process). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The plurality of micro-lenses 412 are then formed by selectively etching the micro-lens material according to the micro-lens template.

Figure 19:
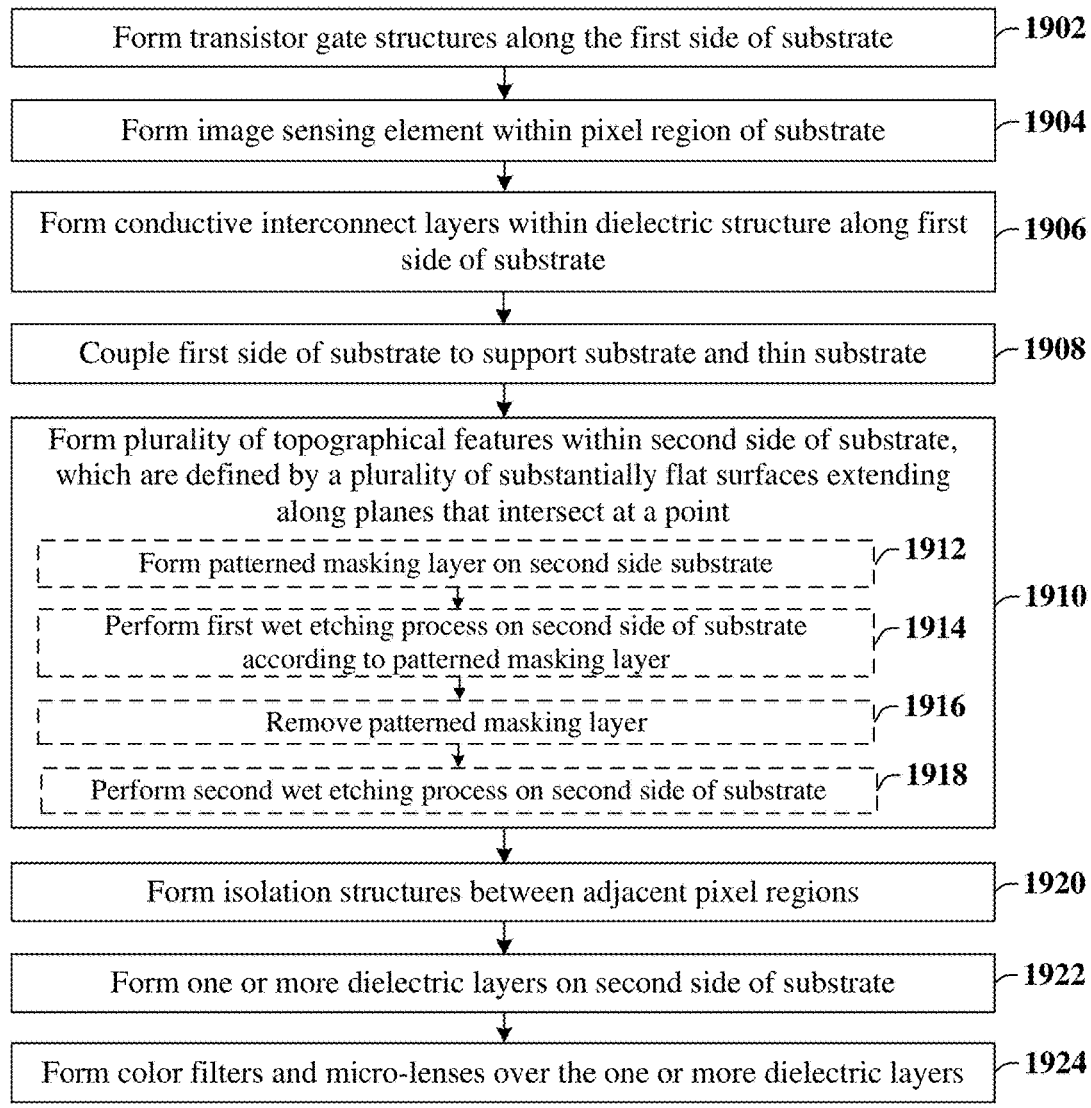
FIG. 19 illustrates a flow diagram of some embodiments of a method of forming an image sensor integrated chip having an absorption enhancement structure defined by substantially flat surfaces.

FIG. 19 illustrates a flow diagram of some embodiments of a method 1900 of forming an image sensor integrated chip having an absorption enhancement structure defined by substantially flat surfaces.

While method 1900 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1902, one or more transistor gate structures are formed along a first side of the substrate. FIG. 9 illustrates a cross-sectional view 900 of some embodiments corresponding to act 1902.

At 1904, an image sensing element is formed within a pixel region of the substrate. FIG. 9 illustrates a cross-sectional view 900 of some embodiments corresponding to act 1904.

At 1906, a plurality of conductive interconnect layers are formed within a dielectric structure along the first side of the substrate. FIG. 10 illustrates a cross-sectional view 1000 of some embodiments corresponding to act 1906.

At 1908, a first side of a substrate is coupled to a support substrate and the substrate is thinned to reduce a thickness of the substrate. FIG. 11 illustrates a cross-sectional view 1100 of some embodiments corresponding to act 1908.

At 1910, a plurality of topographical features are formed within a second side of the substrate. The plurality of topographical features are defined by a plurality of substantially flat surfaces extending along planes that intersect at a point. In various embodiments, the plurality of topographical features may comprise pyramidal shaped protrusions or pyramidal shaped depressions. In some embodiments, the plurality of topographical features may be formed according to acts 1912-1918.

At 1912, a patterned masking layer is formed on the second side of the substrate. FIG. 12 illustrates a cross-sectional view 1200 of some embodiments corresponding to act 1912.

At 1914, a first wet etching process is performed on the second side of the substrate according to the patterned masking layer. FIG. 13 illustrates a cross-sectional view 1300 of some embodiments corresponding to act 1914.

At 1916, the patterned masking layer is removed. FIG. 14A illustrates a cross-sectional view 1400 of some embodiments corresponding to act 1916.

At 1918, a second wet etching process is performed on the second side of the substrate. FIG. 15 illustrates a cross-sectional view 1500 of some embodiments corresponding to act 1918.

At 1920, isolation structures are formed between adjacent pixel regions. FIGS. 16-17 illustrate cross-sectional views 1600-1700 of some embodiments corresponding to act 1920.

At 1922, one or more dielectric layers are formed on the second side of the substrate. FIG. 18 illustrates a cross-sectional view 1800 of some embodiments corresponding to act 1922.

At 1924, color filters and micro-lenses are formed over the one or more dielectric layers. FIG. 18 illustrates a cross-sectional view 1800 of some embodiments corresponding to act 1924.

Accordingly, in some embodiments, the present disclosure relates to an image sensor integrated chip having an absorption enhancement structure comprising topographical features that are respectively defined by substantially flat surfaces of a substrate, which extend along planes intersecting at a point. The substantially flat surfaces of the substrate are formed by one or more wet etching processes, so as to mitigate defects along the substantially flat surfaces that can degrade performance of the image sensor integrated chip.

In some embodiments, the present disclosure relates to an integrated chip. The integrated chip includes an image sensing element disposed within a pixel region of a substrate; and a plurality of conductive interconnect layers disposed within a dielectric structure arranged along a first side of the substrate; a second side of the substrate includes a plurality of interior surfaces arranged directly over the image sensing element, the plurality of interior surfaces respectively have a substantially flat surface that extends along a plane. In some embodiments, the plurality of interior surfaces include a group of substantially flat surfaces that extend along planes that intersect at a point that is between the plurality of interior surfaces. In some embodiments, the point is arranged over the substrate and separated from the substrate by a non-zero distance. In some embodiments, the plurality of interior surfaces respectively include a triangular shape. In some embodiments, the integrated chip further includes an isolation region disposed between the pixel region and an adjacent pixel region, the isolation region defined by an upper surface of the substrate that extends in an unbroken loop surrounding the pixel region. In some embodiments, the upper surface of the substrate is arranged along a horizontal plane that is vertically separated from tops of the interior surfaces by one or more non-zero distances. In some embodiments, the plurality of interior surfaces define a first pyramidal shaped cavity separated from a second pyramidal shaped cavity by a ridge, the ridge vertically below the upper surface of the substrate. In some embodiments, the upper surface is defined by jagged edges of the substrate as viewed from a top-view. In some embodiments, the plurality of interior surfaces define a first pyramidal shaped cavity separated from a second pyramidal shaped cavity by a ridge, the ridge extending along a line between outer edges of the pixel region. In some embodiments, the plurality of interior surfaces define a first pyramidal shaped protrusion separated from a second pyramidal shaped protrusion by a channel extending along a line between outer edges of the pixel region.

In other embodiments, the present disclosure relates to an integrated circuit. The integrated circuit includes an image sensing element disposed within a substrate; and a plurality of conductive interconnect layers disposed within a dielectric structure arranged along a first side of the substrate opposing a second side of the substrate; the second side of the substrate has a plurality of interior surfaces arranged directly over the image sensing element and defining a plurality of topographical features, the plurality of interior surfaces include triangular shaped surfaces. In some embodiments, the plurality of topographical features have a pyramidal shape with a substantially square shaped base. In some embodiments, the substrate includes silicon and the triangular shaped surfaces respectively extend along a (111) crystal plane of the silicon. In some embodiments, a group of four of the plurality of interior surfaces extend along four planes that intersect at a point that is at or over a top of the group of four of the plurality of interior surfaces. In some embodiments, the plurality of topographical features respectively include a pyramidal shaped protrusion. In some embodiments, the plurality of topographical features respectively include a pyramidal shaped cavity. In some embodiments, the integrated chip further includes an isolation region having a deep trench isolation structure including one or more dielectric materials arranged within a trench in a substantially planar upper surface of the substrate, the deep trench isolation structure continuously extends around a pixel region including the image sensing element. In some embodiments, the plurality of topographical features are arranged in rows and columns within a pixel region comprising the image sensing element; and a first row has a first number of topographical features and a second row has a second number of topographical features that is different than the first number of topographical features.

In yet other embodiments, the present disclosure relates to a method of forming an integrated chip. The method includes forming an image sensing element within a substrate; forming a masking layer on a first side of the substrate; performing a first wet etching process on the first side of the substrate with the masking layer in place; removing the masking layer; and performing a second wet etching process on the first side of the substrate, the first wet etching process and the second wet etching process collectively form a plurality of topographical features respectively defined by a plurality of substantially flat interior surfaces that extend along planes that intersect at a point. In some embodiments, the method further includes forming one or more dielectric materials on the first side of the substrate and laterally between adjacent ones of the plurality of topographical features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensing integrated chip, comprising:
    a semiconductor substrate having sidewalls defining one or more trenches on opposing sides of a region of the semiconductor substrate;
    one or more dielectrics disposed within the one or more trenches;
    wherein the semiconductor substrate comprises a plurality of flat surfaces arranged within a pixel region that is laterally between the one or more trenches, adjacent ones of the plurality of flat surfaces defining a plurality of triangular shaped protrusions and alternative ones of the plurality of flat surfaces being substantially parallel to one another, as viewed along a cross-sectional view; and
    wherein outermost ones of the plurality of flat surfaces arranged along a periphery of the pixel region extend vertically past inner ones of the plurality of flat surfaces within a central part of the pixel region, as viewed along the cross-sectional view.

2. The image sensing integrated chip of claim 1, further comprising:
    a fill material directly between adjacent ones of the plurality of triangular shaped protrusions, wherein the fill material has a rounded corner facing the semiconductor substrate.

3. The image sensing integrated chip of claim 1, further comprising:
    a fill material directly between adjacent ones of the plurality of triangular shaped protrusions, wherein lines extending along adjacent surfaces of the fill material intersect at a point that is vertically separated from a topmost point of the fill material.

4. The image sensing integrated chip of claim 1, further comprising:
    a dielectric structure continuously extending along the plurality of flat surfaces of the semiconductor substrate, the dielectric structure having rounded corners; and
    a fill material arranged directly between the adjacent ones of the plurality of flat surfaces and covering a surface of the dielectric structure facing away from the semiconductor substrate.

5. The image sensing integrated chip of claim 4, wherein the dielectric structure extends along the sidewalls of the semiconductor substrate defining the one or more trenches.

6. The image sensing integrated chip of claim 1,
    wherein the plurality of flat surfaces are arranged along a back-side of the semiconductor substrate; and
    wherein the one or more trenches have a first width, a second width greater than the first width, and a third width less than the second width, the first width being closer to the back-side than the second width and the second width being closer to the back-side than the third width.

7. The image sensing integrated chip of claim 1, wherein the semiconductor substrate comprises a horizontally extending surface directly coupled to an outermost one of the plurality of flat surfaces and to one of the sidewalls of the semiconductor substrate defining the one or more trenches, the horizontally extending surface being separated from the outermost one of the plurality of flat surfaces by an obtuse angled measured through the semiconductor substrate.

8. The image sensing integrated chip of claim 1,
    wherein the semiconductor substrate comprises a lower surface directly coupled to an outermost one of the plurality of flat surfaces and to one of the sidewalls of the semiconductor substrate defining the one or more trenches;
    wherein a horizontally extending line extends from the lower surface along a first side of the plurality of flat surfaces to the lower surface along an opposing second side of the plurality of flat surfaces, the horizontally extending line parallel to the lower surface; and
    wherein the plurality of flat surfaces are vertically separated from the horizontally extending line.

9. The image sensing integrated chip of claim 8, wherein the plurality of flat surfaces are vertically separated from the horizontally extending line by a distance that is between approximately 10 nm and approximately 100 nm.

10. The image sensing integrated chip of claim 1, wherein a horizontally extending line extends between bottoms of the sidewalls of the semiconductor substrate, the plurality of flat surfaces being vertically separated from the horizontally extending line by one or more non-zero distances below the semiconductor substrate.

11. An image sensing integrated chip, comprising:
    a semiconductor substrate;
    one or more isolation structures disposed within the semiconductor substrate, wherein the one or more isolation structures are laterally separated from one another in a cross-sectional view;
    wherein the semiconductor substrate comprises a serrated surface arranged along a back-side of the semiconductor substrate and laterally between the one or more isolation structures, the serrated surface comprising a plurality of triangular shaped protrusions in the cross-sectional view; and
    wherein the one or more isolation structures have a first width, a second width greater than the first width, and a third width less than the second width, the first width being closer to the back-side than the second width and the second width being closer to the back-side than the third width.

12. The image sensing integrated chip of claim 11, wherein the semiconductor substrate comprises a flat surface arranged between an outermost one of the plurality of triangular shaped protrusions and the one or more isolation structures.

13. The image sensing integrated chip of claim 12, wherein the plurality of triangular shaped protrusions respectively have a bottommost point that is vertically above the flat surface of the semiconductor substrate.

14. The image sensing integrated chip of claim 11, further comprising:
a fill material having a second serrated surface facing the semiconductor substrate, the second serrated surface defining a second plurality of triangular shaped protrusions with rounded corners in the cross-sectional view, wherein the second plurality of triangular shaped protrusions are interleaved with the plurality of triangular shaped protrusions.

15. The image sensing integrated chip of claim 14, wherein the serrated surface is devoid of plasma damage.

16. The image sensing integrated chip of claim 15,
wherein the semiconductor substrate comprises a horizontally extending surface directly coupled to opposing ends of the serrated surface in the cross-sectional view; and
wherein an imaginary horizontally extending line extends along the horizontally extending surface, the plurality of triangular shaped protrusions being vertically separated from the imaginary horizontally extending line by non-zero distances.

17. The image sensing integrated chip of claim 11, further comprising:
a grid structure having segments arranged directly below the one or more isolation structures in the cross-sectional view;
a color filter disposed vertically below the grid structure and laterally between the segments of the grid structure; and
a micro-lens disposed below the color filter.

18. The image sensing integrated chip of claim 11, further comprising:
a passivation structure continuously extending along the serrated surface of the semiconductor substrate, the passivation structure having a first rounded corner facing the semiconductor substrate and a second rounded corner facing away from the semiconductor substrate.

19. The image sensing integrated chip of claim 18, wherein the first rounded corner is laterally separated from the second rounded corner.

20. An image sensor integrated chip, comprising:
a semiconductor substrate comprising a first side having a first plurality of surfaces defining a first plurality of triangular shaped protrusions with rounded corners, sidewalls extending into the semiconductor substrate and defining one or more trenches on opposing sides of the triangular shaped protrusions, and a flat surface coupled between the first plurality of surfaces and the sidewalls, as viewed in a cross-sectional view;
a plurality of conductive interconnects disposed within a dielectric structure arranged along a second side of the semiconductor substrate;
one or more isolation structures disposed within the one or more trenches and having a first width, a second width greater than the first width, and a third width less than the second width, wherein the first width is closer to the first side than the second width and the second width is closer to the first side than the third width;
a passivation structure continuously extending along the first plurality of surfaces and along the sidewalls of the semiconductor substrate, the passivation structure having rounded corners over the triangular shaped protrusions;
a fill material having a second plurality of surfaces facing the semiconductor substrate, the second plurality of surfaces defining a second plurality of triangular shaped protrusions with rounded corners as viewed in the cross-sectional view, wherein the second plurality of triangular shaped protrusions are interleaved with the first plurality of triangular shaped protrusions; and
a color filter disposed on the first side of the semiconductor substrate; and a micro-lens disposed on the color filter.

* * * * *